US012278285B2

(12) United States Patent
Yun et al.

(10) Patent No.: US 12,278,285 B2
(45) Date of Patent: *Apr. 15, 2025

(54) SEMICONDUCTOR DEVICES

(71) Applicant: SAMSUNG ELECTRONICS CO., LTD., Suwon-si (KR)

(72) Inventors: Seungchan Yun, Incheon (KR); Donghwan Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/239,677

(22) Filed: Aug. 29, 2023

(65) Prior Publication Data

US 2023/0411517 A1 Dec. 21, 2023

Related U.S. Application Data

(63) Continuation of application No. 17/038,020, filed on Sep. 30, 2020, now Pat. No. 11,769,830.

(30) Foreign Application Priority Data

Dec. 24, 2019 (KR) .................. 10-2019-0173878

(51) Int. Cl.
*H01L 29/78* (2006.01)
*H01L 21/822* (2006.01)
(Continued)

(52) U.S. Cl.
CPC ...... *H01L 29/7827* (2013.01); *H01L 21/8221* (2013.01); *H01L 21/823412* (2013.01);
(Continued)

(58) Field of Classification Search
CPC ......... H01L 21/8221; H01L 21/823412; H01L 21/823487; H01L 27/0688; H01L 27/088;
(Continued)

(56) References Cited

U.S. PATENT DOCUMENTS 8,039,893 B2    10/2011   Masuoka et al.
9,502,265 B1 *  11/2016   Jiang ................. H01L 29/66469
(Continued)

FOREIGN PATENT DOCUMENTS

JP          6271982         1/2018

OTHER PUBLICATIONS

Office Action in Korean Appln. No. 10-2019-0173878, mailed on Dec. 9, 2024, 16 pages (with English translation).

*Primary Examiner* — Michael M Trinh
(74) *Attorney, Agent, or Firm* — Fish & Richardson P.C.

(57) ABSTRACT

A semiconductor device includes a plurality of channel layers disposed on an active region of a substrate and spaced apart from each other in a first direction, a first gate structure surrounding the plurality of channel layers, first source/drain regions disposed on the active region on both lateral sides of the first gate structure and contacting the plurality of channel layers and spaced apart from each other in a second direction, an element isolation layer disposed on an upper portion of the first gate structure, a semiconductor layer disposed on the element isolation layer and having a vertical region extending in the first direction and including second source/drain regions spaced apart from each other in the first direction, and a second gate structure disposed to surround a portion of the vertical region. The semiconductor device further includes first to fourth contact plugs.

20 Claims, 50 Drawing Sheets

(51) Int. Cl.
*H01L 21/8234* (2006.01)
*H01L 27/06* (2006.01)
*H01L 27/088* (2006.01)
*H01L 27/12* (2006.01)
*H01L 29/423* (2006.01)
*H01L 29/66* (2006.01)
*H01L 29/786* (2006.01)

(52) U.S. Cl.
CPC ........ *H01L 27/0688* (2013.01); *H01L 27/088* (2013.01); *H01L 27/124* (2013.01); *H01L 29/42392* (2013.01); *H01L 29/66666* (2013.01); *H01L 29/78642* (2013.01); *H01L 29/78696* (2013.01)

(58) Field of Classification Search
CPC ............... H01L 27/124; H01L 29/7827; H01L 29/78642; H01L 29/66666; H01L 29/78696; H01L 29/42392; H01L 29/66545
See application file for complete search history.

(56) References Cited

U.S. PATENT DOCUMENTS

| | | | |
|---|---|---|---|
| 9,905,477 | B2 | 2/2018 | Peng |
| 9,941,411 | B2 | 4/2018 | Anderson et al. |
| 10,230,005 | B2 | 3/2019 | Balakrishnan et al. |
| 10,236,292 | B1 | 3/2019 | Frougier et al. |
| 10,256,158 | B1 | 4/2019 | Frougier et al. |
| 10,269,914 | B2 | 4/2019 | Wu et al. |
| 10,297,513 | B1 | 5/2019 | Yamashita et al. |
| 10,381,438 | B2 | 8/2019 | Zhang et al. |
| 10,685,887 | B2 | 6/2020 | Smith et al. |
| 11,081,547 | B2 | 8/2021 | Reboh et al. |
| 11,769,830 | B2* | 9/2023 | Yun .................... H01L 29/66666 257/329 |
| 2011/0108803 | A1 | 5/2011 | Deligianni et al. |
| 2018/0090387 | A1 | 3/2018 | Jacob |
| 2018/0277442 | A1 | 9/2018 | Leobandung |
| 2019/0172755 | A1* | 6/2019 | Smith ................. H01L 27/0922 |
| 2019/0189745 | A1 | 6/2019 | Balakrishnan et al. |
| 2020/0006340 | A1* | 1/2020 | Lilak ................ H01L 29/78696 |
| 2020/0035569 | A1 | 1/2020 | Frougier et al. |
| 2020/0258884 | A1 | 8/2020 | Rachmady et al. |
| 2020/0294866 | A1 | 9/2020 | Cheng et al. |
| 2020/0294998 | A1 | 9/2020 | Lilak et al. |
| 2021/0366916 | A1* | 11/2021 | Ye ..................... H01L 29/42392 |
| 2022/0028992 | A1 | 1/2022 | Stamper et al. |
| 2022/0037528 | A1* | 2/2022 | Chuang ........... H01L 21/823412 |

* cited by examiner

SEMICONDUCTOR DEVICES

CROSS-REFERENCE TO RELATED APPLICATION(S)

This application is a continuation of U.S. application Ser. No. 17/038,020, filed Sep. 30, 2020, which claims benefit of priority to Korean Patent Application No. 10-2019-0173878 filed on Dec. 24, 2019, in the Korean Intellectual Property Office, the disclosure of each is incorporated herein by reference in their entireties.

1. TECHNICAL FIELD

Example embodiments of the present inventive concepts relate to a semiconductor device.

2. DISCUSSION OF RELATED ART

As the demand in the electronics industry for semiconductor devices that have a high performance, high speed, and/or multifunctionality has increased, the integration density of semiconductor devices has also increased. In accordance with the trend for high integration density of a semiconductor device, patterns constituting various circuits may be arranged in a high density. Additionally, to overcome a limitation in operation properties caused by a reduction in the size of a planar metal oxide semiconductor FET (MOSFET), a semiconductor device including a transistor having a three-dimensional structure channel has been developed.

SUMMARY

An example embodiment of the present inventive concepts is a semiconductor device having high integration density.

According to an example embodiment of the present inventive concepts, a semiconductor device includes a plurality of channel layers disposed on an active region of a substrate and spaced apart from each other in a first direction that is perpendicular to an upper surface of the substrate. A first gate structure surrounds the plurality of channel layers. First source/drain regions are disposed on the active region on both lateral sides of the first gate structure and contact the plurality of channel layers. The first source/drain regions are spaced apart from each other in a second direction that is parallel to the upper surface of the substrate. An element isolation layer is disposed on an upper portion of the first gate structure. A semiconductor layer is disposed on the element isolation layer. The semiconductor layer has a vertical region extending in the first direction and includes second source/drain regions spaced apart from each other in the first direction. A second gate structure is disposed to surround a portion of the vertical region. First contact plugs are connected to the first source/drain regions, respectively. A second contact plug is connected to the first gate structure. Third contact plugs are connected to the second source/drain regions, respectively. A fourth contact plug is connected to the second gate structure.

According to an example embodiment of the present inventive concepts, a semiconductor device includes a plurality of channel layers disposed on an active region of a substrate and spaced apart from each other in a first direction that is perpendicular to an upper surface of the substrate. A first gate structure surrounds the plurality of channel layers. First source/drain regions are disposed on the active region on both lateral sides of the first gate structure and contact the plurality of channel layers. The first source/drain regions are spaced apart from each other in a second direction that is parallel to the upper surface of the substrate. A semiconductor layer is disposed on an upper portion of the first gate structure. The semiconductor layer has a vertical region extending in the first direction, and includes second source/drain regions spaced apart from each other in the first direction. A second gate structure is disposed to surround a portion of a lateral surface of the semiconductor layer.

According to an example embodiment of the present inventive concepts, a semiconductor device includes a first transistor including a plurality of channel layers disposed to be spaced apart from each other in a first direction perpendicular to an upper surface of a substrate and a first gate structure surrounding the plurality of channel layers. A second transistor is disposed to be spaced apart from the first gate structure in the first direction, and includes a semiconductor layer having a vertical region extending in the first direction and a second gate structure disposed to surround a portion of the vertical region. A channel of the first transistor extends in a second direction that is parallel to the upper surface of the substrate and is perpendicular to the first direction along the plurality of channel layers, and a channel of the second transistor extends in the first direction along the vertical region.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION OF EXAMPLE EMBODIMENTS

Hereinafter, example embodiments of the present inventive concepts will be described as follows with reference to the accompanying drawings.

Figure 1:
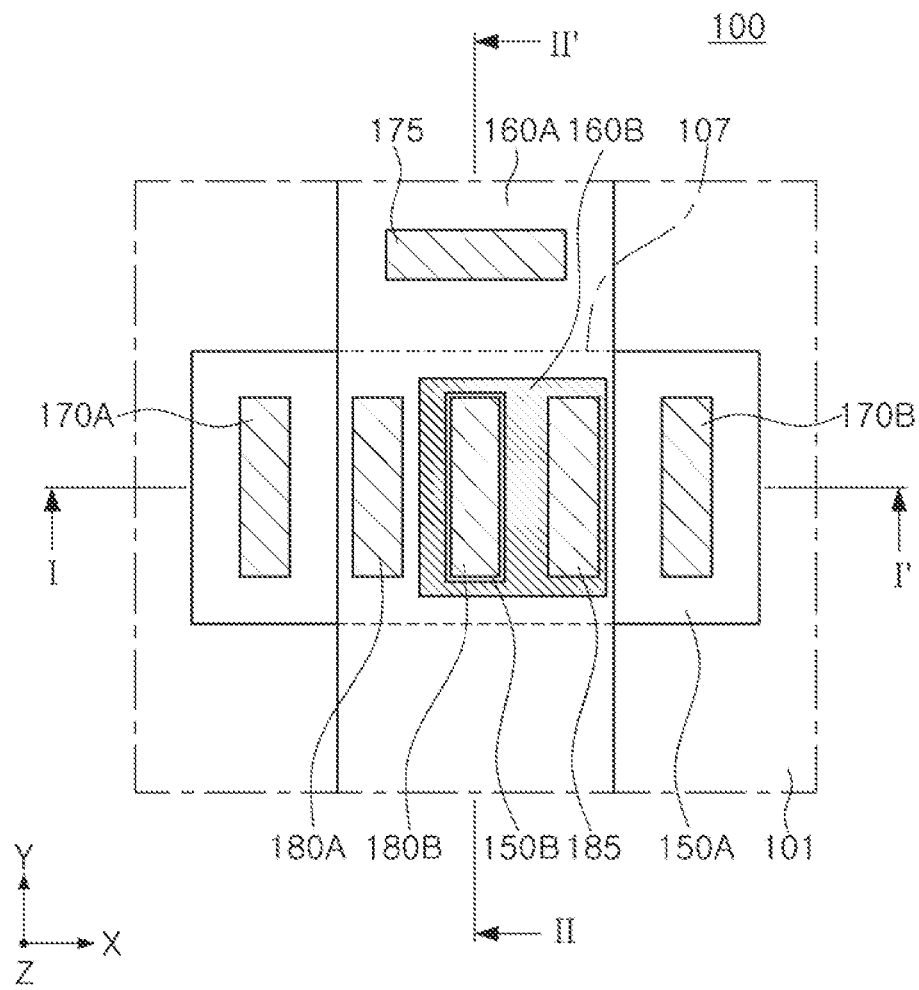
FIG. 1 is a plan view illustrating a semiconductor device according to an example embodiment of the present inventive concepts.

FIG. 1 is a plan view illustrating a semiconductor device according to an example embodiment of the present inventive concepts.

Figure 2A:
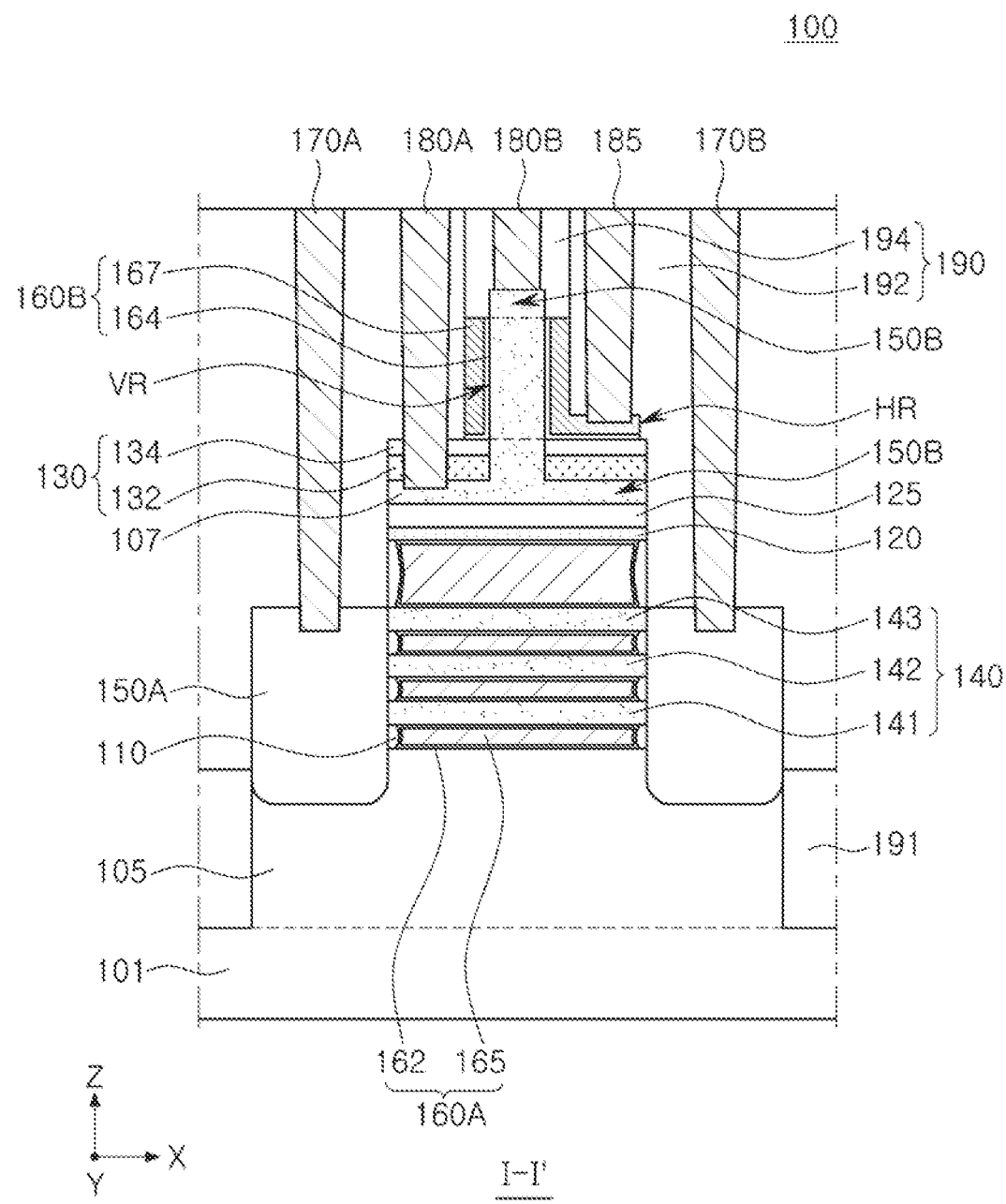
FIG. 2A is a cross-sectional views taken along line I-I' of FIG. 1 illustrating a semiconductor device according to an example embodiment of the present inventive concepts.
Figure 2B:
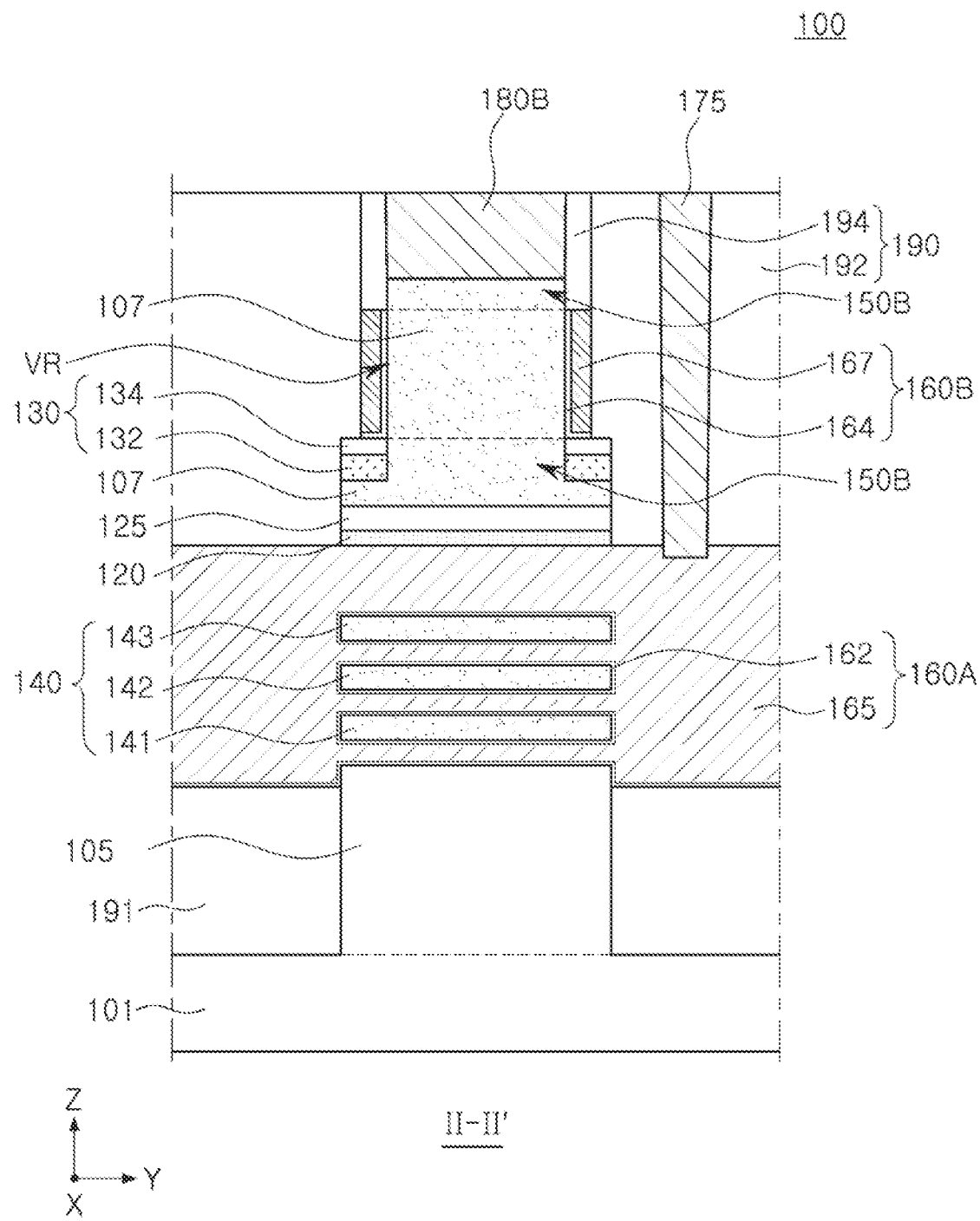
FIG. 2B is a cross-sectional views taken along line II-II' of FIG. 1 illustrating a semiconductor device according to an example embodiment of the present inventive concepts.

FIGS. 2A and 2B are cross-sectional views illustrating a semiconductor device according to example embodiments of the present inventive concepts. FIGS. 2A and 2B are cross-sectional views illustrating the semiconductor device illustrated in FIG. 1 taken along lines I-I' and respectively. For ease of description, FIGS. 1, 2A and 2B illustrate only main elements of the semiconductor device.

Referring to the example embodiments of FIGS. 1, 2A and 2B, a semiconductor device 100 may include a substrate 101 including active regions 105 and a channel structure 140 including a plurality of channel layers disposed on the active regions 105 and spaced apart from each other vertically. For example, as shown in the example embodiment of FIG. 2B, the channel structure 140 may include a first channel layer 141, a second channel layer 142 and a third channel layer 143. However, example embodiments of the present inventive concepts are not limited thereto and the number of the plurality of channel layers may vary in other example embodiments. The first channel layer 141, second channel layer 142 and third channel layer 143 are spaced apart from each other in a Z direction that is perpendicular to an upper surface of the substrate 101. The semiconductor device 100 may further include first source/drain regions 150A in contact with the first to third channel layers 141, 142, and 143, a first gate structure 160A intersecting with the active regions 105 and extending, and surrounding the first to third channel layers 141, 142, and 143, an element isolation layer 125 disposed on an upper portion of the first gate structure 160A, a semiconductor layer 107 disposed on the element isolation layer 125 and having a vertical region VR extending in the Z direction, and a second gate structure 160B surrounding a portion of the vertical region VR. The semiconductor device 100 may further include a substrate insulating layer 191, first spacer layers 110, an intermediate semiconductor layer 120, a second spacer layer 130, an interlayer insulating layer 190, first contact plugs 170A and 170B, a second contact plug 175, third contact plugs 180A and 180B, and a fourth contact plug 185.

The semiconductor device 100 may include a first transistor including the channel structure 140, the first source/drain regions 150A, and the first gate structure 160A, and a second transistor including the semiconductor layer 107 including second source/drain regions 150B, and the second gate structure 160B. The first and second transistors may be stacked upwardly and downwardly in the Z direction. The first and second transistors may be spaced apart from each other (e.g., in the Z direction) with the element isolation layer 125 disposed therebetween.

The first transistor may have a gate-all-around type structure in which the first gate structure 160A is disposed between the active regions 105 and the channel structure 140 and between the first to third channel layers 141, 142, and 143 of the channel structure 140, and may be a transistor having a multi-bridge channel FET (MBCFET™) structure. The second transistor may be a vertical FET in which the second gate structure 160B is disposed to surround the vertical region VR of the semiconductor layer 107 (e.g., in the X and Y directions).

The substrate 101 may have an upper surface extending in the X direction and the Y direction. In an example embodiment, the substrate 101 may include a semiconductor material, such as at least one compound selected from a group IV semiconductor, a group III-V compound semiconductor, and a group II-VI compound semiconductor. For example, a group IV semiconductor may include silicon, germanium, and/or silicon-gallium. The substrate 101 may be provided as a bulk wafer, an epitaxial layer, a silicon on insulator (SOI) layer, or a semiconductor on insulator (SeOI) layer, or the like.

The active region 105 may be defined by the substrate insulating layer 191 in the substrate 101, and may be disposed to have a form extending substantially in the X direction. However, example embodiments of the present inventive concepts are not limited thereto. The active region 105 may have an active fin structure protruding from the substrate 101 (e.g., in the Z direction). The active region 105 may be formed as a portion of the substrate 101, or may include an epitaxial layer grown from the substrate 101. In describing the active region 105 with respect to the substrate 101, the substrate 101 may either be described to include the active region 105, or the active region 105 may be described to be disposed on the substrate 101 without a difference in structure between these two descriptions. As shown in the example embodiment of FIG. 2A, the active region 105 may be partially recessed on both sides (e.g., lateral sides in the X direction) of the first gate structure 160A, and the first source/drain regions 150A may be disposed on the recessed active region 105. In an example embodiment, the active region 105 may include impurities, and may have a structure having a planar upper surface, rather than a structure protruding in the form of fin.

The substrate insulating layer 191 may define the active region 105 on the substrate 101. In an example embodiment, the substrate insulating layer 191 may be formed by a shallow trench isolation process (STI) process. In an example embodiment, the substrate insulating layer 191 may also include a region further extending to a lower portion of the substrate 101. A height and a shape of an upper surface of the substrate insulating layer 191 may vary and are not limited to the shapes and heights shown in FIGS. 1-2B. In an example embodiment, the substrate insulating layer 191 may be formed of an insulating material, such as oxide, nitride, or a combination thereof.

The channel structure 140 may include first to third channel layers 141, 142, and 143 that are spaced apart from each other in the Z direction, for example, on the active region 105. The first to third channel layers 141, 142, and 143 may be connected to the first source/drain regions 150A and may be spaced apart from an upper surface of the active region 105. For example, as shown in the example embodiment of FIG. 2B, the gate electrode 165 of the first gate structure 160A may be disposed between the first channel layer 141 and an upper surface of the active region 105. As shown in the example embodiment of FIG. 2B, each of the first to third channel layers 141, 142, 143 may have a width (e.g., length in the Y direction) that is the same as or similar to a width of the active region 105. The first to third channel layers 141, 142, 143 may have a length in the X direction that is the same as or similar to a length of the first gate structure 160A in the X direction. However, example embodiments of the present inventive concepts are not limited thereto. For example, in an example embodiment, each of the first to third channel layers 141, 142, and 143 may have a relatively reduced length in the X direction such that lateral surfaces of the first to third channel layers 141, 142, and 143 may be positioned on a lower portion of the first gate structure 160A (e.g., between the first source/drain regions in the X direction).

In an example embodiment, the first to third channel layers 141, 142, 143 may be formed of a semiconductor material, and may include at least one compound selected from silicon (Si), silicon-gallium (SiGe), and germanium (Ge). The first to third channel layers 141, 142, 143 may be formed of a material that is the same as a material of the substrate 101. In an example embodiment, the first to third channel layers 141, 142, and 143 may further include an impurities region positioned in a region adjacent to the first source/drain regions 150A. The number and a shape of the first to third channel layers 141, 142, 143 may be varied and are not limited to those shown in the example embodiments of FIGS. 1-2B. For example, in an example embodiment, the channel structure 140 may further include a channel layer disposed directly on an upper surface of the active region 105.

The first source/drain regions 150A may be disposed on the active region 105 on both sides of the channel structure 140. The first source/drain regions 150A may be provided as a source region or a drain region of the first transistor. The first source/drain regions 150A may be disposed to cover a lateral surface (e.g., lateral ends in the X direction) of each of the first to third channel layers 141, 142, and 143 of the channel structure 140. The first source/drain regions 150A may be disposed on a recessed portion of an upper portion of the active region 105. However, example embodiments of the present inventive concepts are not limited thereto and the presence of the recess and a depth of the recess may be varied in other example embodiments.

In an example embodiment, the first source/drain regions 150A may be formed of a semiconductor material. For example, the first source/drain regions 150A may include at least one compound selected from silicon gallium (SiGe), silicon (Si), silicon arsenide (SiAs), silicon phosphide (SiP), and silicon carbide (SiC). The first source/drain regions 150A may be formed of epitaxial layers. For example, the first source/drain regions 150A may include silicon (Si) doped as n-type and/or silicon gallium (SiGe) doped as p-type. In an example embodiment, the first source/drain regions 150A may include a plurality of regions including elements and/or doping elements having different concentrations. Also, in an example embodiment, the first source/drain regions 150A may be connected to or merged with each other on two or more active regions 105 disposed adjacently in the Y direction.

The first gate structure 160A may be disposed to intersect the active region 105 and the channel structure 140 on upper portions of the active region 105 and between the plurality of layers of the channel structure 140 and to extend longitudinally in one direction (e.g., the Y direction). However, example embodiments of the present inventive concepts are not limited thereto. In an example embodiment, a channel of the first transistor may be formed on the active region 105 and/or the channel structure 140 intersecting the first gate structure 160A. In an example embodiment, the portion of the first gate structure 160A disposed above the channel structure 140 may have a relatively greater thickness (e.g., length in the Z direction) than the portion of the first gate structure 160A disposed between the plurality of channel layers 141, 142, and 143. However, example embodiments of the present inventive concepts are not limited thereto. For example, in an example embodiment, the portion of the first gate structure 160A disposed between the plurality of channel layers, such as the first to third channel layers 141, 142, 143, may have different structures than the portion of the first gate structure 160A disposed above the channel structure 140. As shown in the example embodiments of FIGS. 2A-2B, the first gate structure 160A may include a gate electrode 165, and a gate dielectric layer 162 disposed between the gate electrode 165 and the first to third channel layers 141, 142, and 143.

The gate dielectric layer 162 may be disposed between the active region 105 and the gate electrode 165 and between the channel structure 140 and the gate electrode 165, and may be disposed to cover at least a portion of the surfaces of the gate electrode 165. For example, as shown in the example embodiments of FIGS. 2A-2B, the gate dielectric layer 162 may be disposed to surround all the surfaces of the gate electrode 165. In an example embodiment, the gate dielectric layer 162 may include at least one material selected from oxide, nitride, and a high-k material. The high-k material may refer to a dielectric material having a dielectric constant higher than the dielectric constant of a silicon oxide film ($SiO_2$). For example, in an example embodiment, the high-k material may be at least one compound selected from aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed to fill a region between adjacent channel layers of the first to third channel layers 141, 142, and 143 and between the active region 105 and the first channel layer 141 on an upper portion of the active region 105 and to extend above an upper portion of the channel structure 140. The gate electrode 165 may be spaced apart from the first to third channel layers 141, 142, and 143 by the gate dielectric layer 162. In an example embodiment, the gate electrode 165 may include a conductive material, such as a metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as a doped polysilicon. However, example embodiments of the present inventive concepts are not limited thereto.

The first spacer layers 110 may be disposed on both lateral sides (e.g., lateral edges in the X direction) of the gate electrode 165 and on upper and lower surfaces of the plurality of channel layers of the channel structures 140. The gate electrode 165 may be spaced apart from the first source/drain regions 150A by the first spacer layers 110 and may be electrically isolated from each other. An upper gate electrode 165 disposed above the third channel layer 143 may be spaced apart from a first interlayer insulating layer 192 by the first spacer layers 110. As shown in the example embodiment of FIG. 2A, a lateral surface of the first spacer layers 110 (e.g., lateral ends in the X direction) facing the gate electrode 165 may have a rounded shape (e.g., a substantially convex shape) curved inwardly towards the gate electrode 165. However, example embodiments of the present inventive concepts are not limited thereto. In an example embodiment, the first spacer layers 110 may be formed of oxide, nitride, and/or oxynitride, and may be formed of a low-k film. For example, the first spacer layers 110 may include at least one compound selected from SiN, SiCN, SiOCN, SiBCN, and SiBN.

The intermediate semiconductor layer 120 may be disposed on the first gate structure 160A and may have lateral surfaces (e.g., lateral ends in the X and Y directions) that are substantially coplanar with lateral surfaces of the channel structure 140 disposed in a lower portion of the semiconductor device 100 and of the semiconductor layer 107 disposed in an upper portion of the semiconductor device 100. In an example embodiment, the intermediate semiconductor layer 120 may include a semiconductor material, such as silicon (Si). However, example embodiments of the present inventive concepts are not limited thereto. The intermediate semiconductor layer 120 may be an epitaxial layer. However, example embodiments of the present inventive concepts are not limited thereto and in some example embodiments, the intermediate semiconductor layer 120 may not be provided.

The element isolation layer 125 may be disposed on the intermediate semiconductor layer 120 on an upper portion of the first gate structure 160A. For example, as shown in the example embodiment of FIGS. 2A-2B, a bottom surface of the element isolation layer 125 may directly contact a top surface of the intermediate semiconductor layer 120. The lateral surfaces (e.g., lateral ends in the X and Y directions) of the element isolation layer 125 may be substantially coplanar with lateral surfaces (e.g., lateral ends in the X and Y directions) of the channel structure 140, the intermediate semiconductor layer 120, and a lower surface of the semiconductor layer 107. The element isolation layer 125 may be a layer electrically and physically isolating the first transistor in a lower portion of the semiconductor device 100 from the second transistor in an upper portion of the semiconductor device 100. In an example embodiment, the element isolation layer 125 may include an insulating material, such as at least one material selected from an oxide, nitride, and an oxynitride. However, example embodiments of the present inventive concepts are not limited thereto.

The semiconductor layer 107 may be disposed on the element isolation layer 125. For example, as shown in the example embodiments of FIGS. 2A-2B, a bottom surface of the semiconductor layer 107 may directly contact a top surface of the element isolation layer 125. The semiconductor layer 107 may include the second source/drain regions 150B disposed on each of an upper end and a lower end of the semiconductor layer 107 (e.g., in the Z direction). The second source/drain regions 150B may be configured as impurities regions in the semiconductor layer 107. As shown in the example embodiments of FIGS. 2A and 2B, a boundary between the second source/drain regions 150B is marked by a dotted line. However, example embodiments of the present inventive concepts are not limited thereto. The semiconductor layer 107 may have the vertical region VR protruding from a planar lower region to an upper portion of the semiconductor device 100. The planar lower region of the semiconductor layer 107 may have lateral surfaces (e.g., lateral ends in the X and Y directions) that are substantially coplanar with lateral surfaces of the element isolation layer 125, the channel structure 140, and the intermediate semiconductor layer 120. The vertical region VR may have lateral surfaces (e.g., lateral ends in the X and Y directions) that are narrower than the lateral surfaces of the planar lower region of the semiconductor layer 107. For example, the vertical region VR may extend to the upper portion of the semiconductor device 100 in a form of fin. The upper portion of the second source/drain region 150B may be disposed on an upper end of the vertical region VR. The lower portion of the second source/drain region 150B may include the planar lower region of the semiconductor layer 107 having lateral surfaces (e.g., lateral ends in the X and Y directions) substantially coplanar with lateral surfaces (e.g., lateral ends in the X and Y directions) of the channel structure 140, the intermediate semiconductor layer 120, and the element isolation layer 125. The lower portion of the second source/drain region 150B may also include a lower portion of the vertical region VR having a narrower width than the planar lower region of the semiconductor layer 107.

The semiconductor layer 107 may be formed of a semiconductor material. For example, in an example embodiment, the semiconductor layer 107 may include at least one compound selected from silicon-gallium (SiGe), silicon (Si), silicon arsenide (SiAs), silicon phosphide (SiP), and silicon carbide (SiC). The semiconductor layer 107 may be formed of an epitaxial layer. For example, the semiconductor layer 107 may include first conductivity-type impurities, and the second source/drain regions 150B may include second conductivity-type impurities. The impurities in the second source/drain regions 150B may have a conductivity-type that is the same as or different from that of the impurities in the first source/drain regions 150A.

The second gate structure 160B may be disposed to surround a portion of the vertical region VR of the semiconductor layer 107. The second gate structure 160B may surround the vertical region VR within a range of a certain height. As illustrated in FIG. 1, the second gate structure 160B may be disposed to entirely overlap (e.g., in the Z direction) the first gate structure 160A in a plan view (e.g., in a plane defined in the X and Y directions). The second gate structure 160B may have an area smaller than the area of the first gate structure 160A on a plane (e.g., in a plane defined in the X and Y directions) and may be disposed on an upper portion of the first gate structure 160A. The second gate structure 160B may be disposed to overlap (e.g., in the Z direction) a portion of the semiconductor layer 107 and a portion of the element isolation layer 125 on a plane to expose a portion of the second spacer layer 130. The second gate structure 160B may have a horizontal extension portion HR extending along an upper surface of the second spacer layer 130 (e.g., in the X direction). The second gate structure 160B may be connected to the fourth contact plug 185 in the horizontal extension portion HR.

As shown in the example embodiments of FIGS. 2A-2B, the second gate structure 160B may include a gate electrode 167, and a gate dielectric layer 164 disposed between the gate electrode 167 and the semiconductor layer 107, such as the vertical region VR of the semiconductor layer 107. The gate dielectric layer 164 may extend from a lateral surface of the semiconductor layer 107 (e.g., lateral ends in the X and Y direction) onto an upper surface of the second spacer layer 130 to cover an internal lateral surface facing the vertical region VR and a lower surface of the gate electrode 167. In an example embodiment, the gate dielectric layer 164 and the gate electrode 167 may include the same material as the gate dielectric layer 162 and the gate electrode 165 described above.

The second spacer layer 130 may be disposed between the second gate structure 160B and the planar lower region of the semiconductor layer 107 (e.g., in the Z direction) and may allow the second gate structure 160B to be spaced apart from the semiconductor layer 107. For example, as shown in the example embodiment of FIGS. 2A and 2B an upper surface of the second spacer layer 130 may directly contact a lower surface of the second gate structure 160B and a lower surface of the second spacer layer 130 may directly contact an upper surface of the planar lower region of the semiconductor layer 107. The gate electrode 167 may be spaced apart from and electrically isolated from the lower portion of the second source/drain regions 150B by the second spacer layers 130. The second spacer layer 130 may include first and second layers 132 and 134 including different materials. However, example embodiments of the present inventive concepts are not limited thereto and in other example embodiments, the second spacer layer 130 may be formed of a single layer or three or more layers. In an example embodiment, the second spacer layer 130 may be formed of oxide, nitride, and/or oxynitride, and may be formed of a low-k film. For example, the first layer 132 may be a nitride layer and the second layer 134 may be an oxide layer.

The first contact plugs 170A and 170B, the second contact plug 175, the third contact plugs 180A and 180B, and the fourth contact plug 185 may penetrate the interlayer insulating layer 190 and may extend (e.g., in the Z direction) to a lower portion of the semiconductor device 100. As shown in the example embodiment of FIGS. 2A-2B, the first contact plugs 170A and 170B may be connected to the first source/drain regions 150A, and the second contact plug 175 may be connected to the first gate structure 160A. The third contact plugs 180A and 180B may be connected to the second source/drain regions 150B and the fourth contact plug 185 may be connected to the second gate structure 160B, such as the horizontal extension pattern HR of the second gate structure 160B.

The first contact plugs 170A and 170B, the second contact plug 175, the third contact plugs 180A and 180B, and the fourth contact plug 185 may have different heights, and at least one may have an inclined lateral surface. For example, in an example embodiment, a width of a lower portion of at least one of the first contact plugs 170A and 170B, the second contact plug 175, the third contact plugs 180A and 180B, and the fourth contact plug 185 may be narrower than a width of an upper portion, depending an aspect ratio. However, example embodiments of the present inventive concepts are not limited thereto. For example, the sizes and widths of the first contact plugs 170A and 170B, the second contact plug 175, the third contact plugs 180A and 180B, and the fourth contact plug 185 may be varied in other example embodiments.

The first contact plugs 170A and 170B may extend substantially in the Z direction and may be disposed to penetrate the interlayer insulating layer 190 and to recess the first source/drain regions 150A by a certain depth. However, example embodiments of the present inventive concepts are not limited thereto. As shown in the example embodiment of FIG. 2B, the second contact plug 175 may be disposed on one lateral side of the first gate structure 160A in the Y direction adjacent to an external side of the semiconductor layer 107. The second contact plug 175 may extend substantially in the Z direction and may penetrate the interlayer insulating layer 190 and may recess the gate electrode 165 by a certain depth. However, example embodiments of the present inventive concepts are not limited thereto. The third contact plugs 180A and 180B may extend substantially in the Z direction and may penetrate the interlayer insulating layer 190 and may be connected to the lower portion and upper portion of the second source/drain region 150B, respectively. In the example embodiment shown in FIG. 2A, the third contact plug 180B connected to the upper portion of the second source/drain region 150B is illustrated to have a size that is smaller than the size of the upper portion of the second source/drain region 150B (e.g., length in the X direction). However, example embodiments of the present inventive concepts are not limited thereto. For example, in another example embodiment, the third contact plug 180B may expand further than the second source/drain region 150B in the Y direction. The third contact plug 180A connected to the lower portion of the second source/drain region 150B may penetrate the first layer 132 and the second layer 134 of the second spacer layer 130 and may be connected to a lower region of the semiconductor layer 107 in a region in which the second gate structure 160B is not disposed (e.g., the planar lower region of the semiconductor layer 107). As shown in the example embodiment of FIG. 2A, the fourth contact plug 185 may be connected to the gate electrode 167 in the horizontal extension portion HR of the second gate structure 160B.

In an example embodiment, the first contact plugs 170A and 170B, the second contact plug 175, the third contact plugs 180A and 180B, and the fourth contact plug 185 may include, for example, a metal nitride such as a titanium nitride film (TiN), a tantalum nitride film (TaN), or a tungsten nitride film (WN), and/or a metal material such as aluminum (Al), tungsten (W), or molybdenum (Mo). In an example embodiment, the first contact plugs 170A and 170B, the second contact plug 175, the third contact plugs 180A and 180B, and the fourth contact plug 185 may include a barrier layer in an outermost region and/or a metal-semiconductor layer such as a silicide layer disposed on an end.

The interlayer insulating layer 190 may be disposed to cover an upper surface of the substrate insulating layer 191, an upper surface of the first source/drain regions 150A, lateral side surfaces and an upper surface of the second gate structure 160B, and other elements. In an example embodiment, the interlayer insulating layer 190 may include at least one material selected from an oxide, nitride, and oxynitride, and may include a low-k material. The interlayer insulating layer 190 may include a first interlayer insulating layer 192 and a second interlayer insulating layer 194 disposed on an upper portion of the second gate structure 160B. The first and second interlayer insulating layers 192 and 194 may include the same material or different materials. However, in an example embodiment, the interlayer insulating layer 190 may include a plurality of layers disposed in various forms according to a process of manufacturing the semiconductor device 100.

In the semiconductor device 100, in the first transistor on a lower portion of the semiconductor device 100, the first source/drain regions 150A may be disposed to be spaced apart from each other in the X direction, and a channel of the first transistor may extend along the active region 105 and the first to third channel layers 141, 142, and 143 in the X direction. In the second transistor on an upper portion of the semiconductor device 100, the second source/drain regions 150B may be disposed to be spaced apart from each other in the Z direction, and a channel may extend in the Z direction along the vertical region VR of the semiconductor layer 107. As described above, in the semiconductor device 100, the transistors in which directions of the channels are perpendicular to each other may be disposed to vertically overlap each other on the substrate 101, thereby providing a semiconductor device 100 having a high integration density.

Figure 3A:
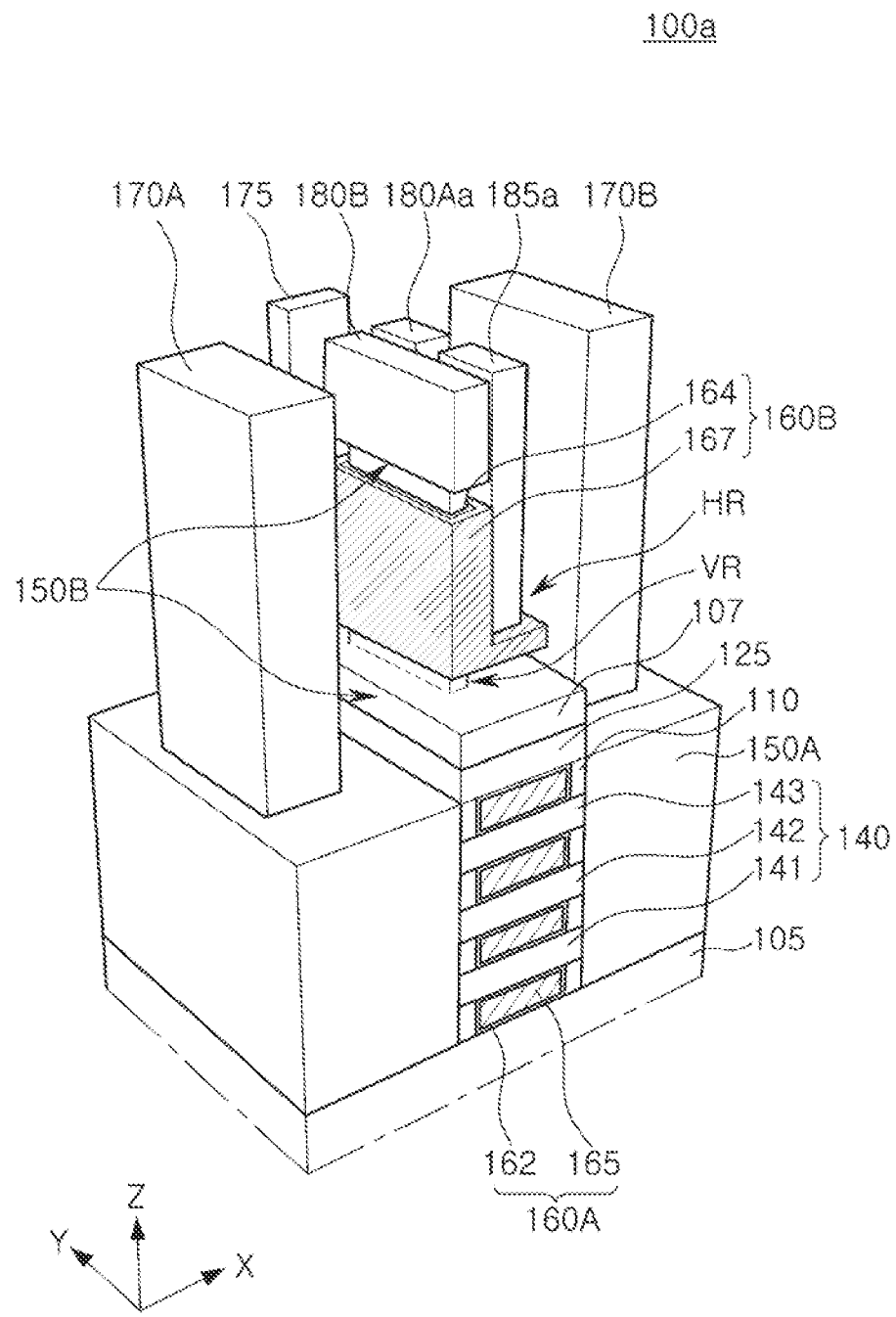
FIGS. 3A and 3B are perspective views illustrating a front side and a rear side of a semiconductor device, respectively, according to example embodiments of the present inventive concepts.
Figure 3B:
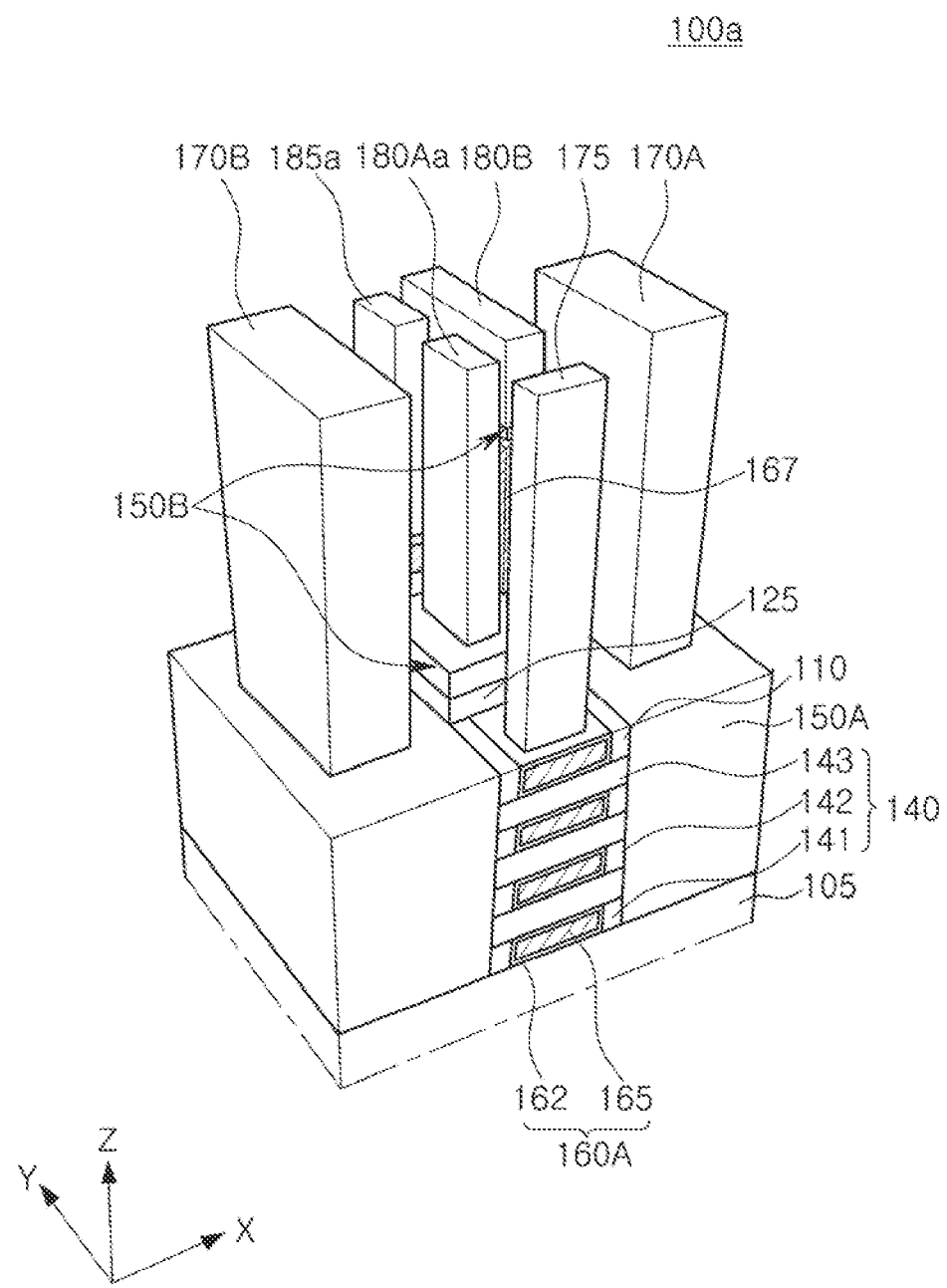

FIGS. 3A and 3B are perspective views illustrating a semiconductor device according to an example embodiment of the present inventive concepts. FIG. 3A is a perspective view of a front surface of the semiconductor device, and FIG. 3B is a perspective view of a rear surface of the semiconductor device. In FIGS. 3A and 3B, a portion of the elements, such as the second spacer layer 130 and the interlayer insulating layer 190, are not illustrated for ease of description.

Referring to the example embodiments of FIGS. 3A and 3B, in a semiconductor device 100*a*, arrangements of a third contact plug 180Aa connected to a lower portion of the second source/drain region 150B and a fourth contact plug 185*a* connected to a second gate structure 160B may be different from the example embodiments illustrated in FIGS. 1 to 2B. The third contact plug 180Aa and the fourth contact plug 185*a* may be disposed adjacent to each other in the Y direction and on one lateral side of the second gate structure 160B in the X direction. Accordingly, the second gate structure 160B may be patterned to not be disposed in a lower portion to which the third contact plug 180Aa may extend. By disposing the third contact plug 180Aa and the fourth contact plug 185*a* as shown in the example embodiment of FIGS. 3A and 3B, a width of the semiconductor device 100*a* in the X direction may be reduced in a region below the third contact plug 180Aa. As shown in the example embodiment of FIG. 3A, a third contact plug 180B connected to the upper portion of the second source/drain region 150B may have a size (e.g., in a plane defined by the X and Y directions) that is greater than the size of an upper surface of the second source/drain region 150B. However, example embodiments of the present inventive concepts are not limited thereto.

As shown in the example embodiment of FIG. 3A, the first gate structure 160A may have substantially the same thickness (e.g., length in the Z direction) in the regions between the channel structures 140 and in the region disposed on an upper portion of the channel structure 140. The upper surfaces of the first source/drain regions 150A may be substantially coplanar (e.g., in the Z direction) with an upper surface of the first gate structure 160A.

As shown in the example embodiments of FIGS. 3A and 3B, the semiconductor device 100*a* may not include an intermediate semiconductor layer 120. Accordingly, a lower surface of the element isolation layer 125 may be disposed to be in direct contact with an uppermost surface of the first gate structure 160A. Also, an internal side surface of a first spacer layer 110 that directly contacts lateral side ends of the first gate structure 160A, may have a non-curved shape.

Figure 4:
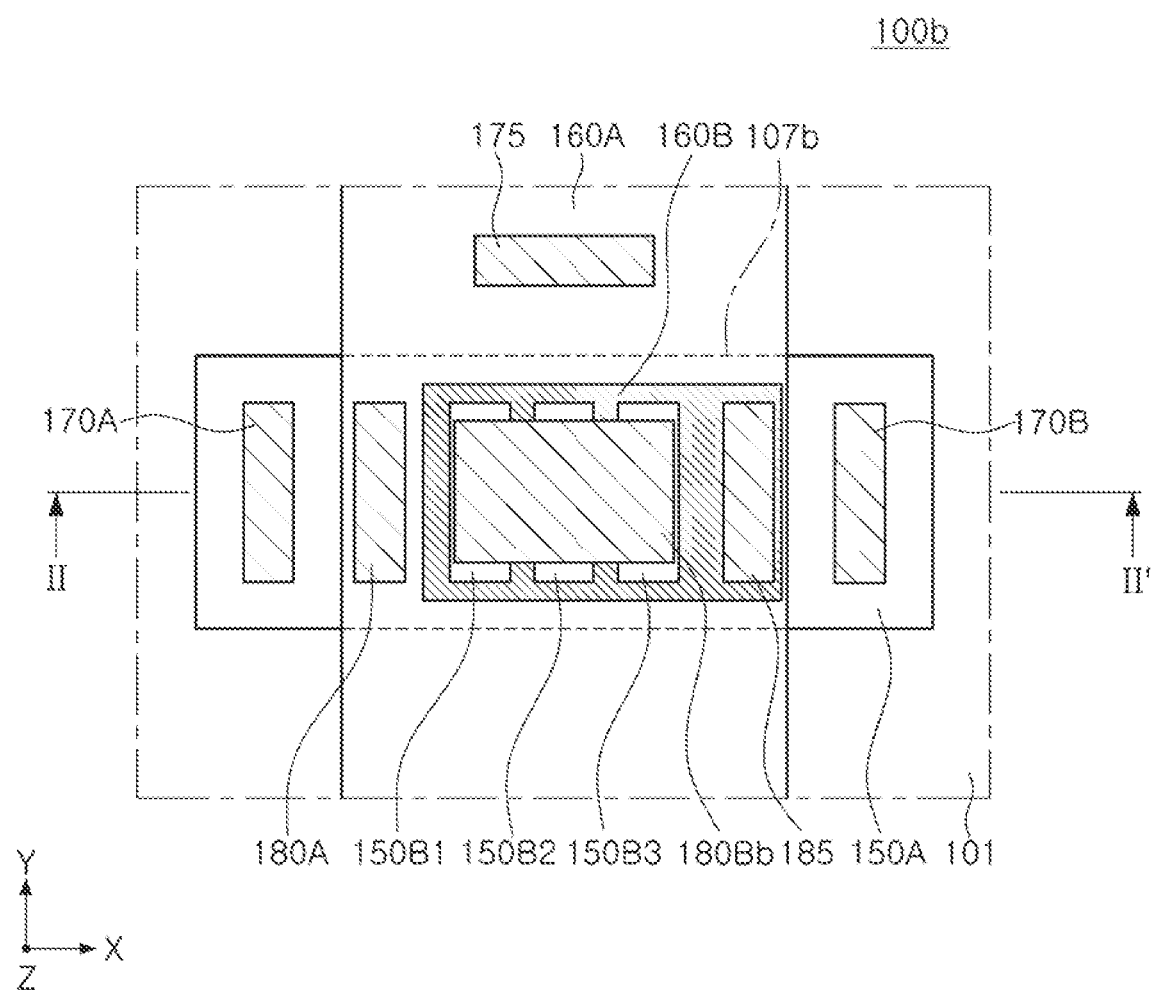
FIG. 4 is a plan view illustrating a semiconductor device according to an example embodiment of the present inventive concepts.
Figure 5:
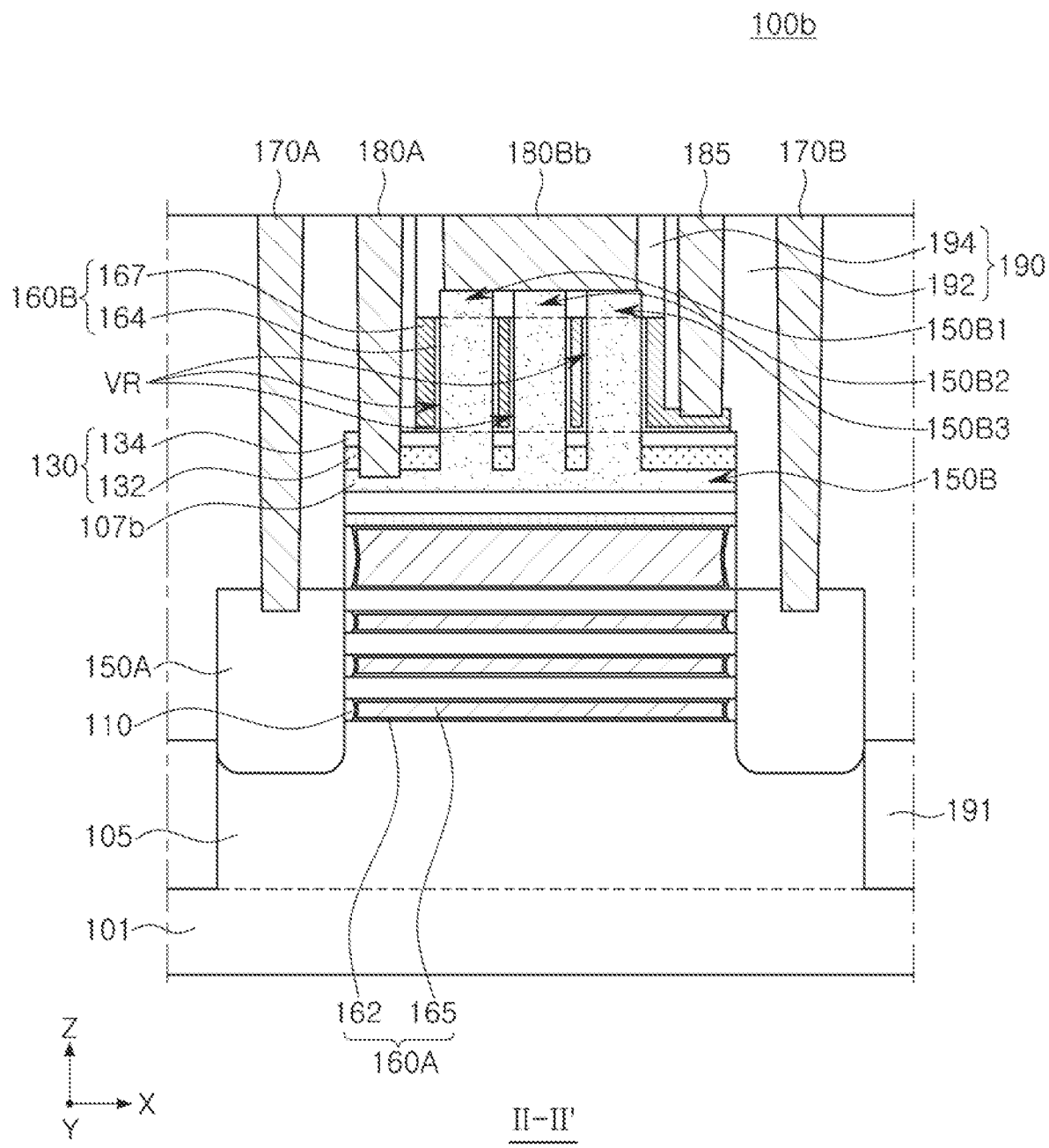
FIG. 5 is a cross-sectional view taken along line II-II' of FIG. 4 illustrating a semiconductor device according to an example embodiment of the present inventive concepts.

FIGS. 4 and 5 are a plan view and a cross-sectional view illustrating a semiconductor device according to example embodiments.

Referring to the example embodiments of FIGS. 4 and 5, in a semiconductor device 100*b*, a semiconductor layer 107*b* may have a plurality of vertical regions VR disposed to be spaced apart from each other. For example, as shown in the example embodiment of FIGS. 4-5, the semiconductor layer 107*b* may have three vertical regions VR disposed to be spaced apart from each other in the X direction. The plurality of vertical regions VR may have a plurality of second source/drain regions comprising 150B1, 150B2, and 150B3 disposed on an upper portion of the semiconductor layer 107*b*. As shown in the example embodiment of FIG. 5, a third contact plug 180Bb may be in direct contact with upper surfaces of the plurality of second source/drain regions 150B1, 150B2, and 150B3 on the upper portion in common and may be connected to the plurality of second source/drain regions 150B1, 150B2, and 150B3 in common. As described above, in the semiconductor device 100*b*, by adjusting the number of the plurality of vertical regions VR, a current amount of a second transistor may be optimized. In an example embodiment, by adjusting a height of the vertical regions VR (e.g., length in the Z direction), electrical properties of the second transistor, such as voltage properties, may be optimized.

Figure 6:
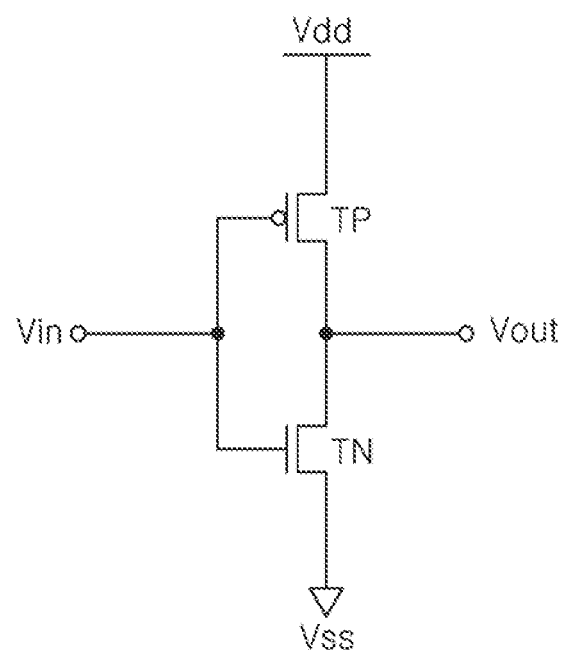
FIG. 6 is a circuit view illustrating a semiconductor device according to an example embodiment of the present inventive concepts.

FIG. 6 is a circuit view illustrating a semiconductor device according to an example embodiment of the present inventive concepts.

Figure 7:
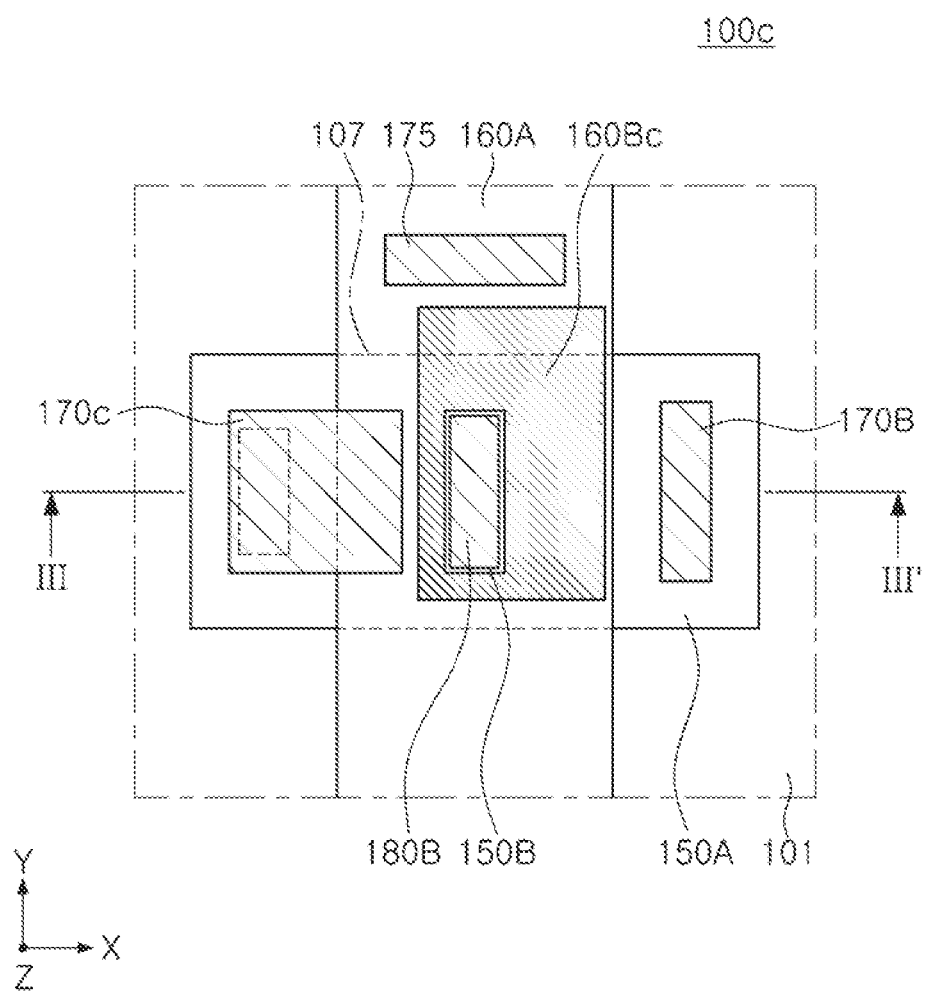
FIG. 7 is a plan view illustrating a semiconductor device according to an example embodiment of the present inventive concepts.
Figure 8:
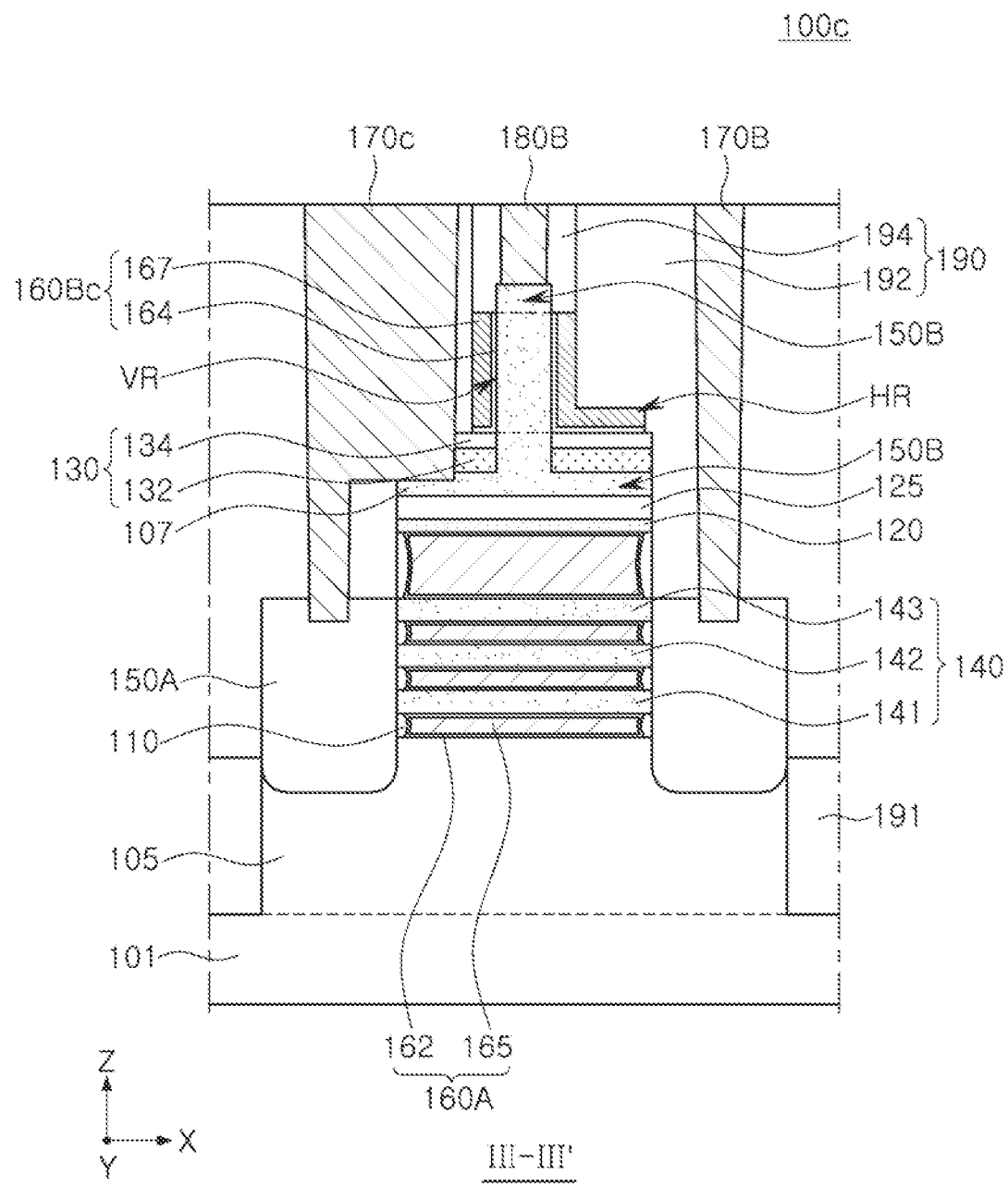
FIG. 8 is a cross-sectional view taken along line of FIG. 7 illustrating a semiconductor device according to an example embodiment of the present inventive concepts.

FIGS. 7 and 8 are a plan view and a cross-sectional view taken along line or FIG. 7 illustrating a semiconductor device according to example embodiments of the present inventive concepts.

Referring to the example embodiment of FIG. 6, an inverter may include a driver transistor TN and a load transistor TP. Gates of the driver transistor TN and the load transistor TP may be connected to an input voltage line Vin, and a source of the load transistor TP may be connected to a power voltage line Vdd. A source of the driver transistor TN may be connected to a ground voltage line Vss, and drains of the driver transistor TN and the load transistor TP may be connected to an output voltage line Vout.

Referring to the example embodiments of FIGS. 7 and 8, a semiconductor device 100*c* may include the inverter illustrated in FIG. 6, and differently from the example embodiments illustrated in FIGS. 1 to 2B, a gate electrode 165 of a first gate structure 160A and a gate electrode 167 of a second gate structure 160Bc may be connected to each other. The semiconductor device 100*c* may include four types of contact plugs comprising first contact plugs 170B, contact structures 170*c*, a second contact plug 175, and third contact plugs 180B.

As illustrated in the example embodiment of FIG. 7, the gate electrode 165 of the first gate structure 160A may be connected to the gate electrode 167 of the second gate structure 160Bc. For example, the second gate structure 160Bc may extend to one side in the Y direction and may be connected to the first gate structure 160A adjacent to an external side of the semiconductor layer 107. Accordingly, the gate electrode 165 of the first gate structure 160A and the gate electrode 167 of the second gate structure 160Bc may be connected to the input voltage line Vin shown in the example embodiment of FIG. 6 in common.

In the example embodiment of FIG. 8, a first source/drain region 150A on a left side and a lower portion of the second source/drain region 150B on the lower planar region of the semiconductor layer 107 may be connected to the output voltage line Vout in common by a single contact structure 170c integrally formed. The contact structure 170c may be disposed to be connected to the semiconductor layer 107 on an upper portion of the semiconductor device 100c, and may be bent to be connected to the first source/drain region 150A on a lower portion of the semiconductor device 100c. However, in an example embodiment, each of the first source/drain region 150A on the left side and the lower portion of the second source/drain region 150B on the lower portion may be connected to a contact plug, and may be electrically connected to each other by a wiring line on the upper portion.

Figure 9A:
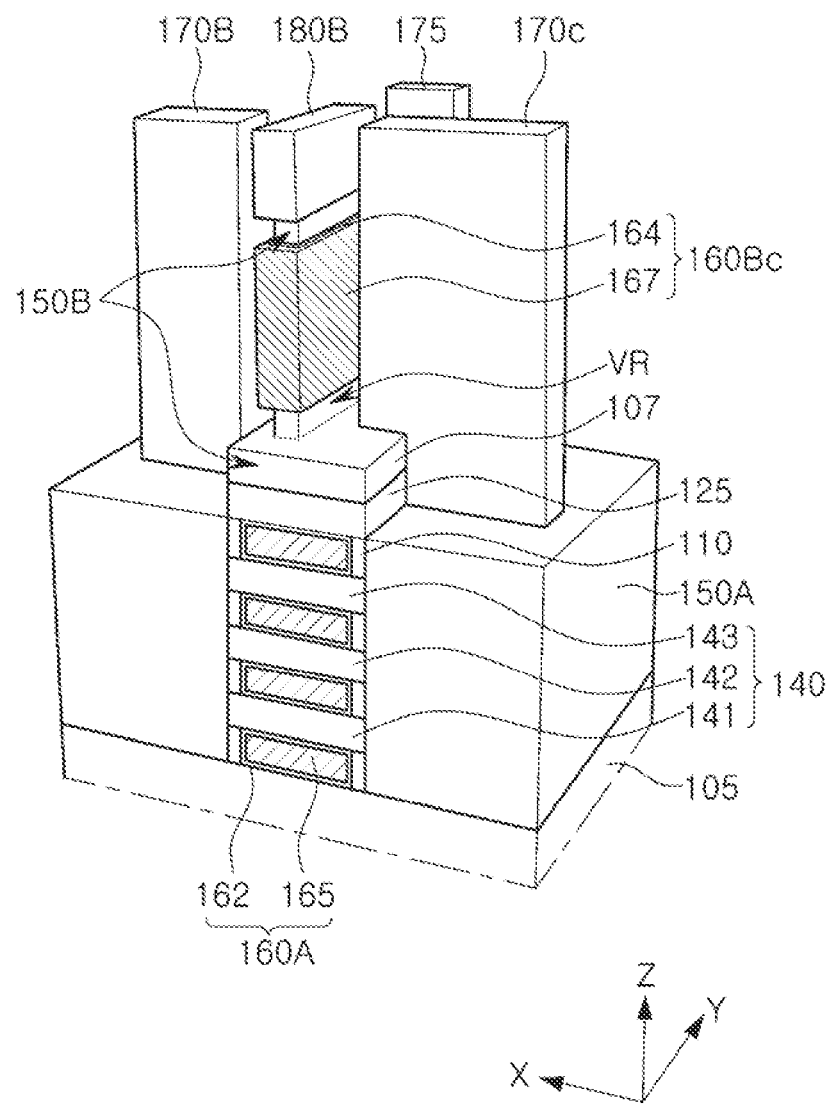
FIGS. 9A and 9B are perspective views illustrating a front side and a rear side of a semiconductor device, respectively, according to example embodiments of the present inventive concepts.
Figure 9B:
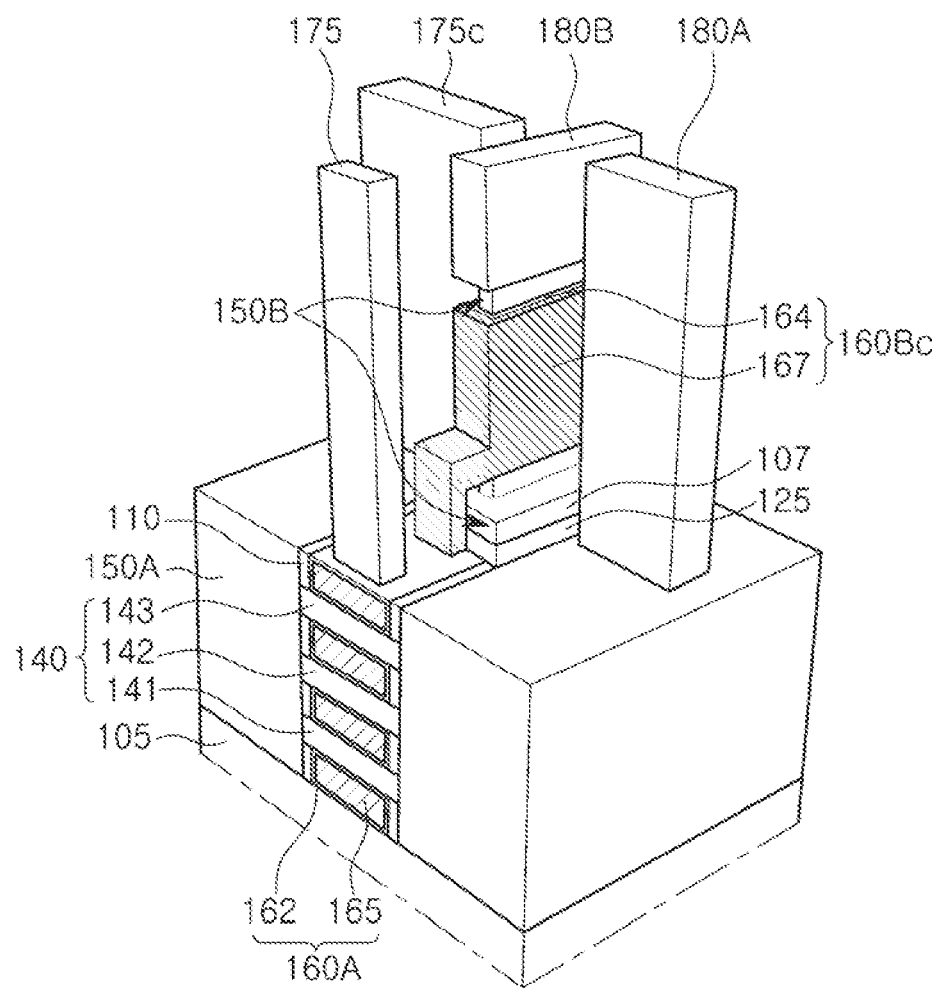

In an example embodiment, a first transistor on a lower portion of the semiconductor device 100c, which includes a channel structure 140 and the first gate structure 160A, may be a PMOS transistor, and a second transistor on an upper portion of the semiconductor device 100c, which includes the semiconductor layer 107 and the second gate structure 160Bc, may be an NMOS transistor. In this example embodiment, in the first transistor, as the first source/drain regions 150A is formed to include silicon-gallium (SiGe), the mobility of a hole may improve by applying stress to a channel of the first transistor. The semiconductor device 100c may secure electrical properties of the transistor as described above, and by vertically stacking the two transistors constituting the inverter, the semiconductor device 100c may have a reduced area. FIGS. 9A and 9B are perspective views illustrating a semiconductor device according to example embodiments of the present inventive concepts. FIG. 9A is a perspective view of a front surface of the semiconductor device, and FIG. 9B is a perspective view of a rear surface of the semiconductor device. A portion of the elements, such as the second spacer layer 130 and the interlayer insulating layer 190, are not illustrated for ease of description.

Referring to the example embodiments of FIGS. 9A and 9B, in a semiconductor device 100d, different from the example embodiments of FIGS. 7 and 8, the portion of a first gate structure 160A constituting an inverter may have the same thickness (e.g., length in the Z direction) between the plurality of channel layers of the channel structures 140 as the portion of the first gate structure 160A constituting an inverter on an upper portion of the channel structure 140. Also, an upper surface of the first source/drain regions 150A may be substantially coplanar with an uppermost surface of the first gate structure 160A. As shown in the example embodiments of FIGS. 9A-9B, the semiconductor device 100d may not include an intermediate semiconductor layer 120. Accordingly, an element isolation layer 125 may be disposed on the first gate structure 160A to be in direct contact with an uppermost surface of the first gate structure 160A. An internal lateral surface of a first spacer layer 110 in contact with the first gate structure 160A may have a non-curved shape.

A gate electrode 167 of a second gate structure 160Bc may be bent on one side in the Y direction and may extend (e.g., in the Z direction) to be connected to an upper surface of the gate electrode 165 of the first gate structure 160A. However, example embodiments of the present inventive concepts are not limited thereto. For example, in another example embodiment, the gate electrode 167 may not be bent and may be formed with a relatively wide width in the Y direction and may be connected to the gate electrode 165.

Figure 10:
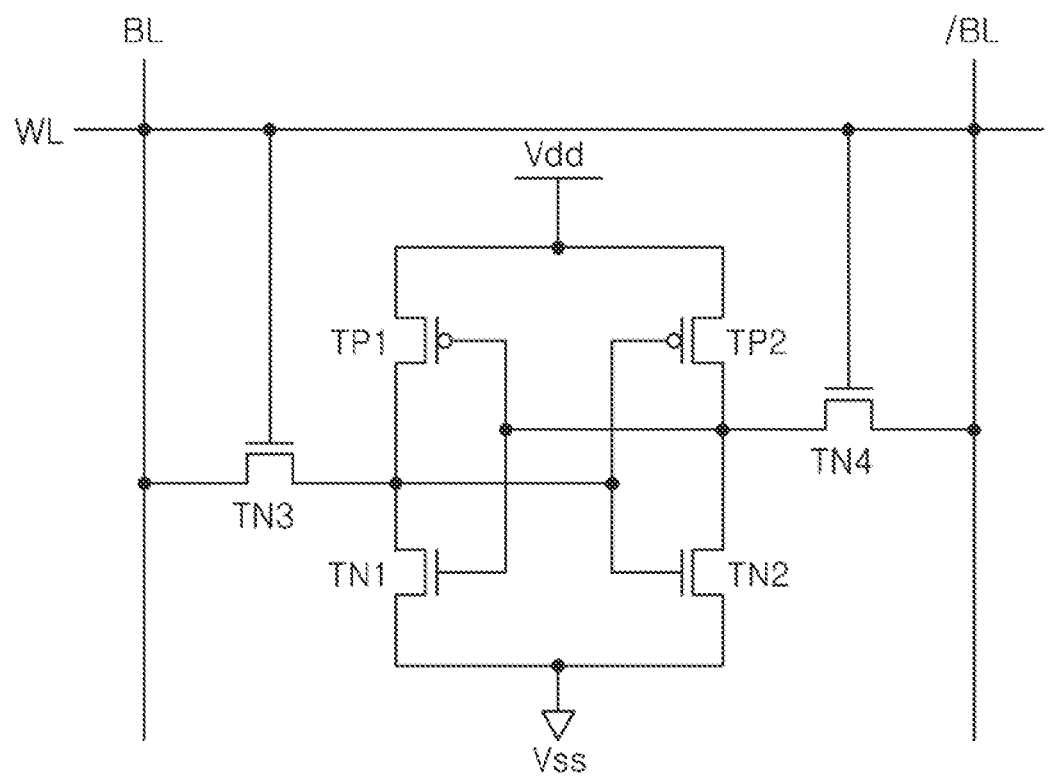
FIG. 10 is a circuit view illustrating an SRAM cell including a semiconductor device according to an example embodiment of the present inventive concepts.

FIG. 10 is a circuit view illustrating an SRAM cell including a semiconductor device according to an example embodiment of the present inventive concepts.

Figure 11:
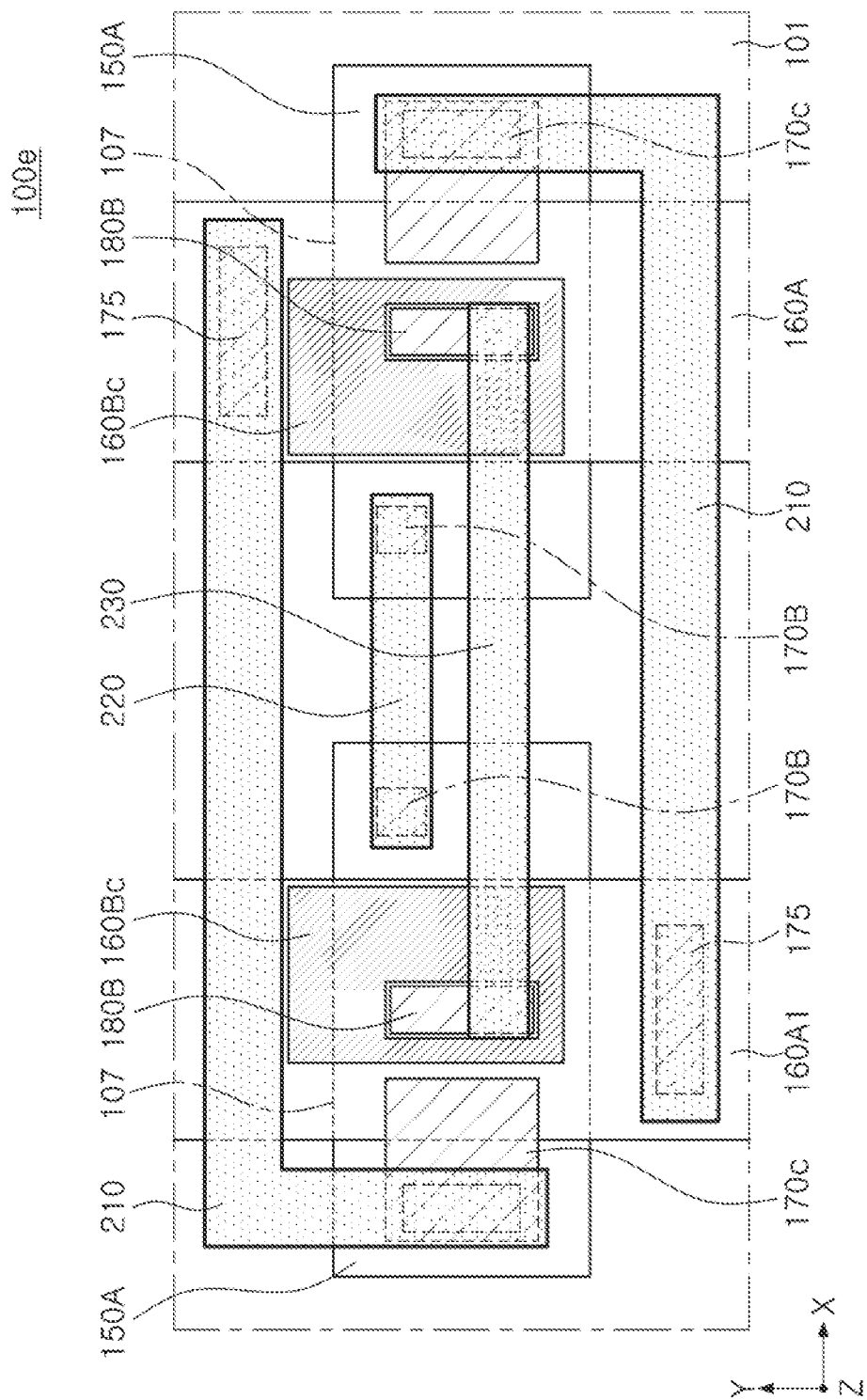
FIG. 11 is a plan view illustrating a semiconductor device according to an example embodiment of the present inventive concepts.
Figure 12A:
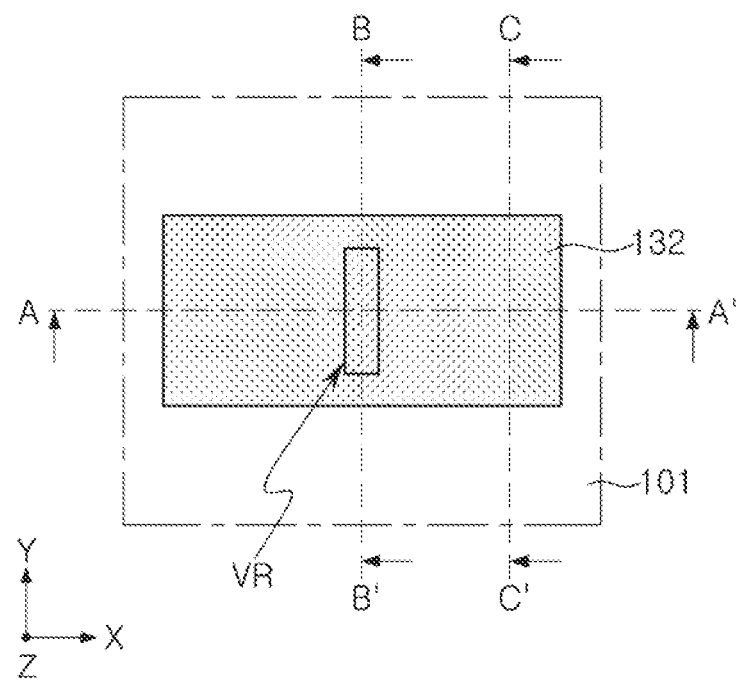
FIGS. 12A, 13A, 14A, 15A, 16A, 17A, 18A, 19A and 20A are plan views illustrating a method of manufacturing a semiconductor device according to example embodiments of the present inventive concepts.
Figure 12B:
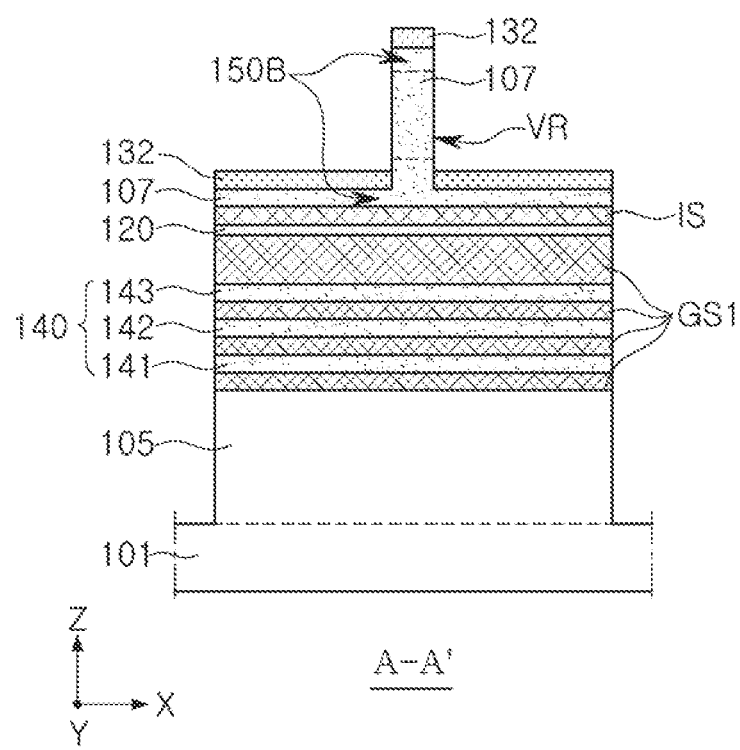
FIGS. 12B, 13B, 14B, 15B, 16B, 17B, 18B, 19B and 20B are cross-sectional views taken along line A-A' of FIGS. 12A, 13A, 14A, 15A, 16A, 17A, 18A, 19A, 20A, respectively, illustrating a method of manufacturing a semiconductor device according to example embodiments of the present inventive concepts.
Figure 12C:
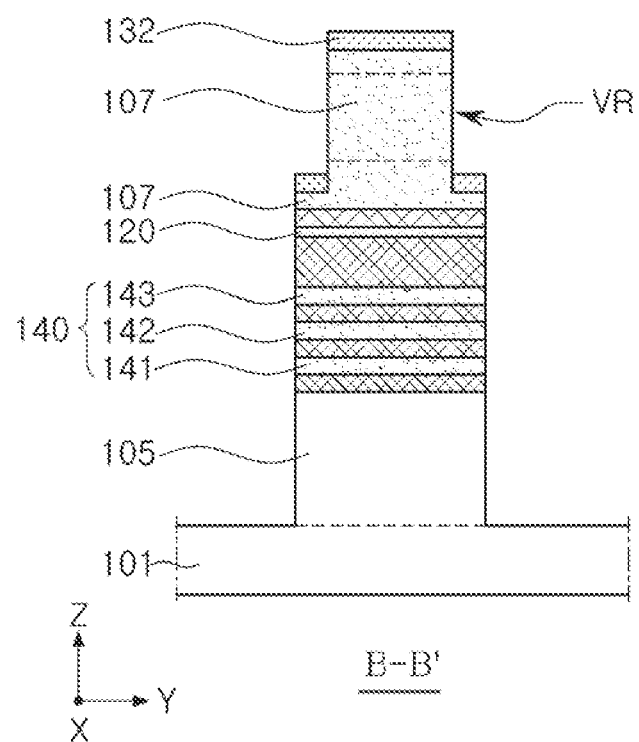
FIGS. 12C, 13C, 14C, 15C, 16C, 17C, 18C, 19C and 20C are cross-sectional views taken along line B-B' of FIGS. 12A, 13A, 14A, 15A, 16A, 17A, 18A, 19A, 20A, respectively, illustrating a method of manufacturing a semiconductor device according to example embodiments of the present inventive concepts.
Figure 12D:
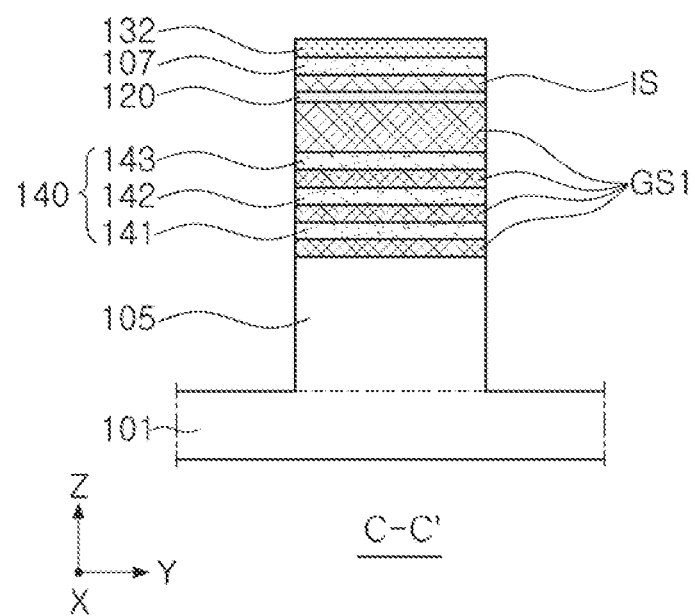
FIGS. 12D, 13D, 14D, 15D, 16D, 17D, 18D, 19D and 20D are cross-sectional views taken along line C-C' of FIGS. 12A, 13A, 14A, 15A, 16A, 17A, 18A, 19A, 20A, respectively, illustrating a method of manufacturing a semiconductor device according to example embodiments of the present inventive concepts.
Figure 13A:
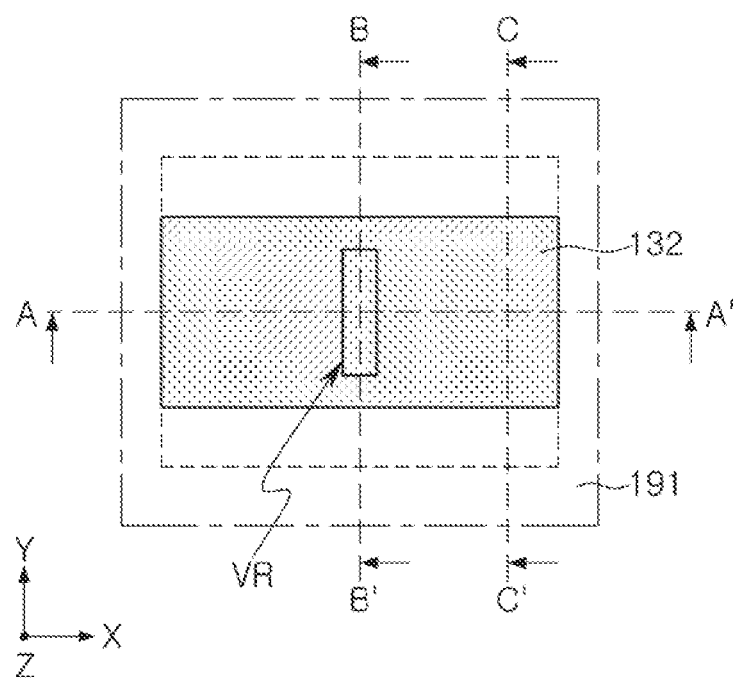
Figure 13B:
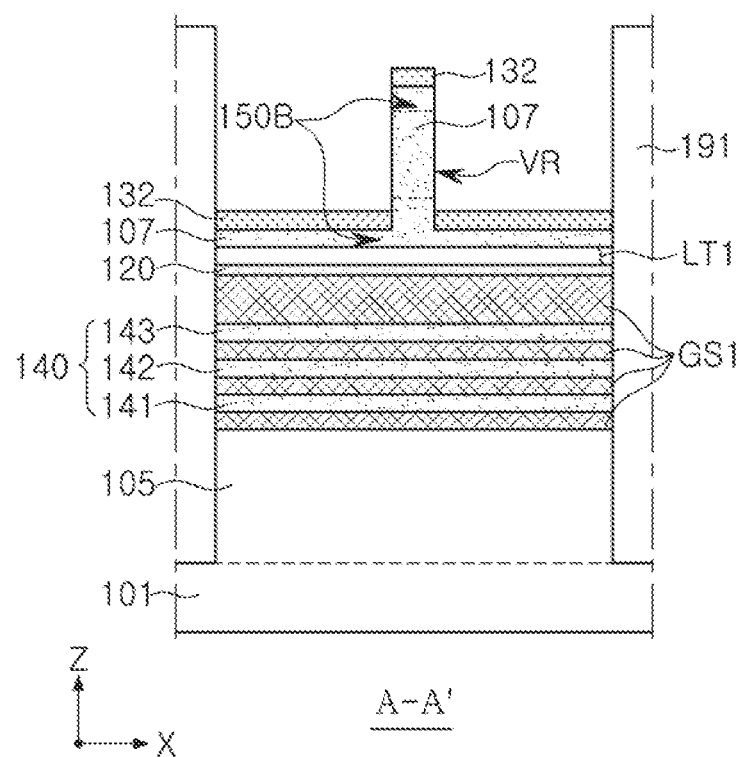
Figure 13C:
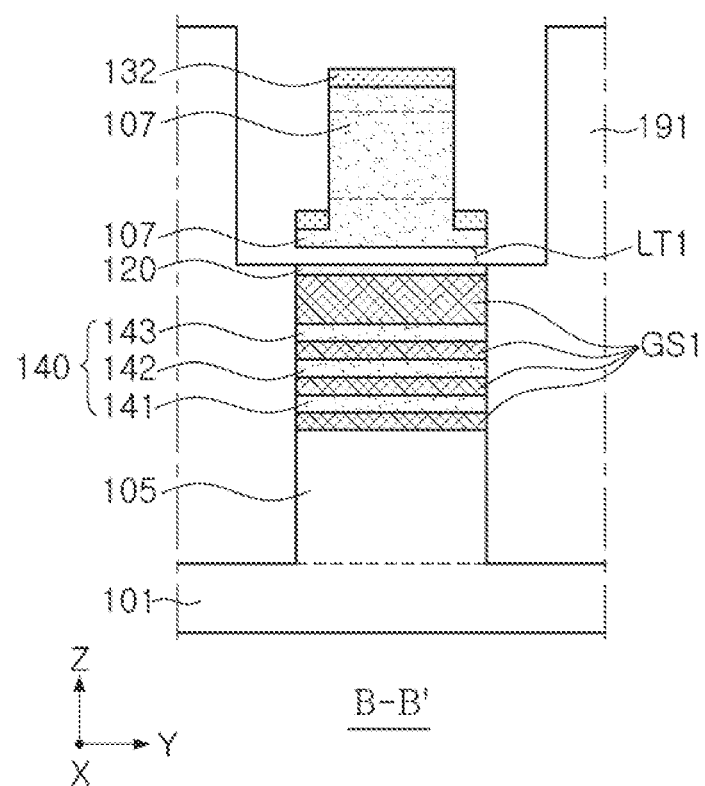
Figure 13D:
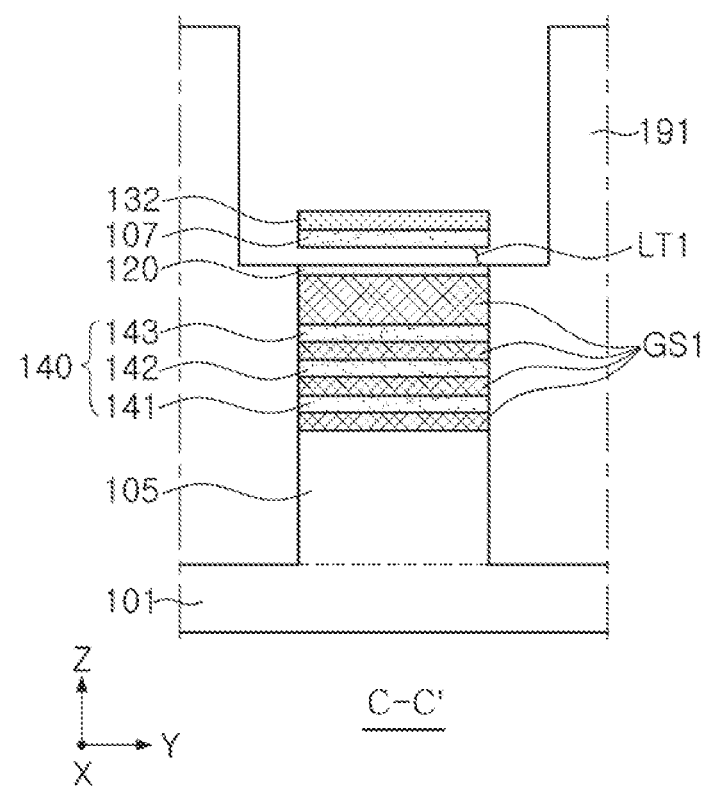
Figure 14A:
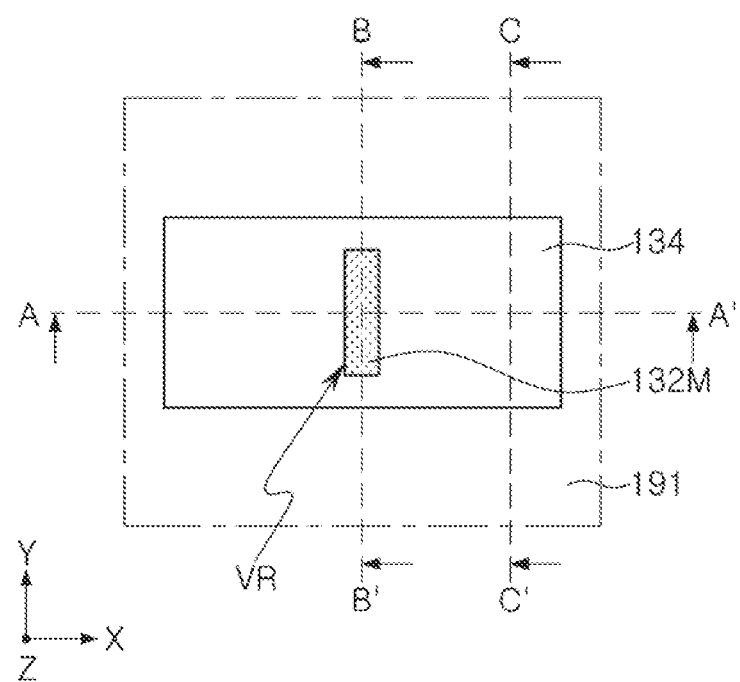
Figure 14B:
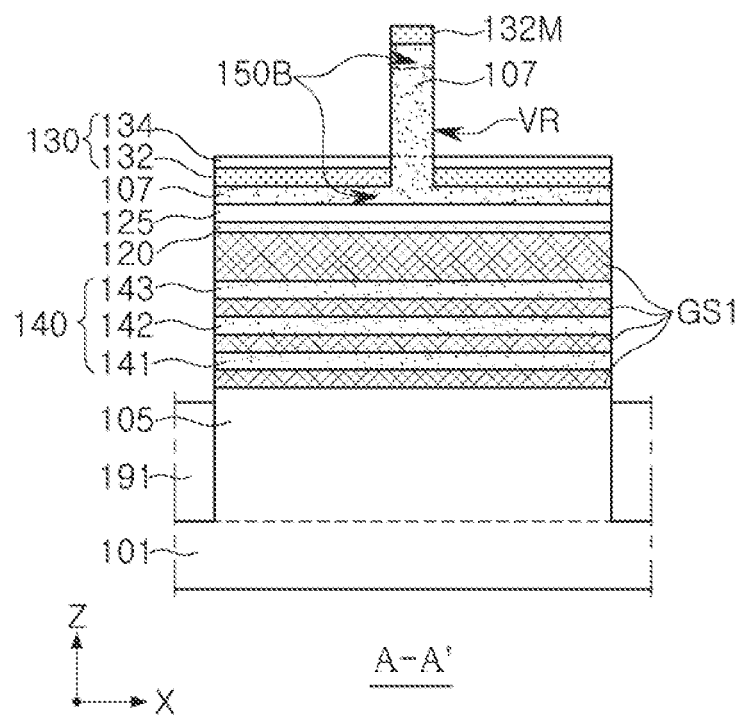
Figure 14C:
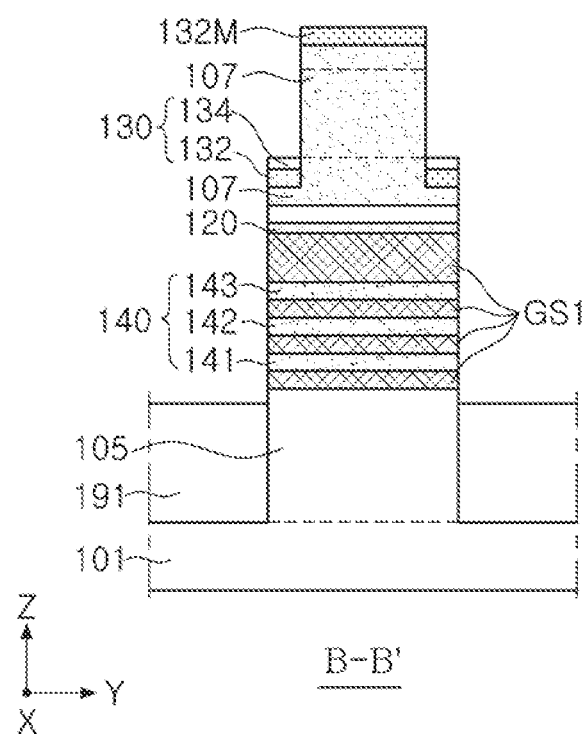
Figure 14D:
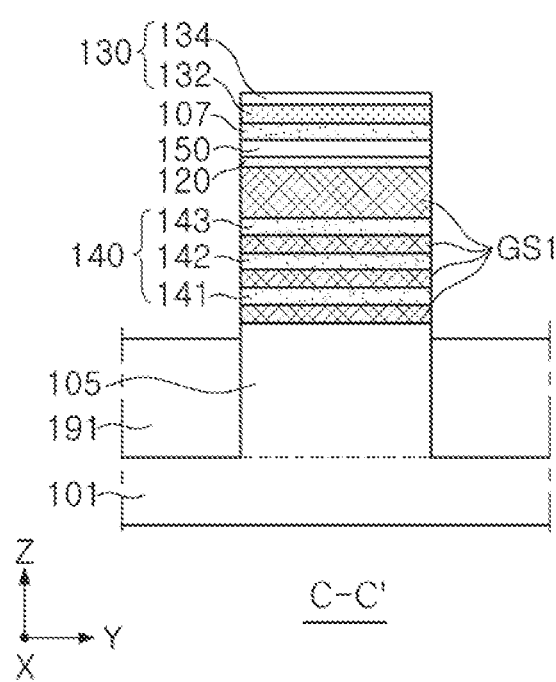

FIG. 11 is a plan view illustrating a semiconductor device according to an example embodiment of the present inventive concepts.

Referring to the example embodiment of FIG. 10, a single cell in an SRAM device may include first and second driver transistors TN1 and TN2, first and second load transistors TP1 and TP2, and first and second access transistors TN3 and TN4. Sources of the first and second driver transistors TN1 and TN2 may be connected to a ground voltage line Vss, and sources of the first and second load transistors TP1 and TP2 may be connected to a power voltage line Vdd.

A first driver transistor TN1 including an NMOS transistor and a first load transistor TP1 including a PMOS transistor may constitute a first inverter, and a second driver transistor TN2 including an NMOS transistor and a second load transistor TP2 including a PMOS transistor may constitute a second inverter. At least one of the first or second inverters may have a structure described in the aforementioned example embodiments shown in FIGS. 7 to 9B.

Output terminals of the first and second inverters may be connected to sources of a first access transistor TN3 and a second access transistor TN4. In an example embodiment, an input terminal and an output terminal of each of the first and second inverters may intersect with each other to form a single latch circuit. Drains of the first and second access transistors TN3 and TN4 may be connected to first and second bit lines BL,/BL, respectively.

FIG. 11 illustrates a semiconductor device 100e including a region of the SRAM device illustrated in the example embodiment of FIG. 10 which includes first and second inverters. The semiconductor device 100e may have a structure in which two devices substantially the same as in the semiconductor device 100c illustrated in the example embodiment of FIG. 7 are disposed adjacent to each other (e.g., adjacent in the X direction) in a symmetrical manner. The semiconductor device 100e may further include first to third wiring lines 210, 220, and 230. A contact structure 170c of one inverter may be connected to a second contact plug 175 of the other inverter by a first wiring line 210. A second wiring line 220 may connect first contact plugs 170B of each of the two inverters to each other. A third wiring line 230 may connect third contact plugs 180B of each of the two inverters to each other. However, example embodiments of the present inventive concepts are not limited thereto. For example, in other example embodiments, a shape and a structure of each of the first to third wiring lines 210, 220, and 230 may be varied and the shape and a position of each of the first contact plugs 170B, the contact structures 170c, the second contact plug 175, and the third contact plugs 180B may be varied.

FIGS. 12A to 20D are views illustrating a method of manufacturing a semiconductor device in a process order according to example embodiments of the present inventive concepts. FIGS. 12A to 20D illustrate an example embodiment of a method of manufacturing the semiconductor device illustrated in FIGS. 1 to 2B, and illustrate plan views and cross-sectional surfaces taken along lines A-A', B-B', and C-C' in the plan view.

Referring to the example embodiments of FIGS. 12A to 20D, after forming a semiconductor structure by alternately stacking first sacrificial layers GS1 and channel layers, such as first to third channel layers 141, 142, and 143, on a substrate 101 and by forming an intermediate semiconductor layer 120, an isolation sacrificial layer IS, and a semiconductor layer 107 (e.g., consecutively stacked in the Z direction), the semiconductor structure may be patterned.

The first sacrificial layers GS1 may be replaced with a gate dielectric layer 162 and a gate electrode 165 through a subsequent process as illustrated in the example embodiments of FIGS. 2A and 2B. The isolation sacrificial layer IS may be replaced with an element isolation layer 125 through a subsequent process as illustrated in the example embodiments of FIGS. 2A and 2B. The first sacrificial layers GS1, the first to third channel layers 141, 142, and 143, the intermediate semiconductor layer 120, the isolation sacrificial layer IS, and the semiconductor layer 107 may include a semiconductor material and may form the semiconductor structure. For example, the above-mentioned elements may be formed by performing an epitaxial growth process using the substrate 101 as a seed.

The first sacrificial layers GS1 may be formed of a material having etch selectivity with respect to the first to third channel layers 141, 142, and 143, the intermediate semiconductor layer 120, and the semiconductor layer 107. The isolation sacrificial layer IS may be formed of a material having etch selectivity with respect to the intermediate semiconductor layer 120 and the semiconductor layer 107. In an example embodiment, the semiconductor structure may include a semiconductor material including at least one compound selected from silicon (Si), silicon-gallium (SiGe), and germanium (Ge), and may or may not include impurities. For example, in an example embodiment, the first sacrificial layers GS1 and the isolation sacrificial layer IS may include silicon-gallium (SiGe), and the first to third channel layers 141, 142, and 143, the intermediate semiconductor layer 120, and the semiconductor layer 107 may include silicon (Si).

The semiconductor structure may be grown on an upper surface of the substrate 101. After forming the semiconductor structure, a vertical region VR may be formed by patterning the semiconductor layer 107. Additionally, the overall semiconductor structure may be patterned using a first layer 132 formed on an upper portion as a mask. The semiconductor layer 107 may include impurities in upper and lower regions, and upper and lower portions of the second source/drain regions 150B may be formed by the impurities. In an example embodiment, the impurities may be doped in-situ during a process of forming the semiconductor layer 107, or may be implanted into the semiconductor layer 107 using an ion-implantation process subsequently.

Referring to the example embodiments of FIGS. 13A to 13D, after forming a substrate insulating layer 191, a first tunnel portion LT1 may be formed by removing the isolation sacrificial layer IS.

The substrate insulating layer 191 may be formed to fill both lateral sides of the semiconductor structure in the X direction, and may be formed to have a region horizontally extending from a lateral surface of the semiconductor structure to partially expose the lateral surface of the semiconductor structure from an upper portion in the Y direction. In the horizontal extension region, the substrate insulating layer 191 may be formed to have an upper surface that is higher than a lower surface of the intermediate semiconductor layer 120.

The isolation sacrificial layer IS exposed by the substrate insulating layer 191 may be selectively removed with respect to the semiconductor layer 107 and the intermediate semiconductor layer 120 such that the first tunnel portion LT1 may be formed.

Referring to the example embodiments of FIGS. 14A to 14D, the element isolation layer 125 may be formed in the first tunnel portion LT1, and a second spacer layer 130 may be formed on the semiconductor layer 107. For example, the second spacer layer 130 may be formed on the lower planar region of the semiconductor layer 107 and may contact lateral surfaces (e.g., lateral side edges in the X direction) of the semiconductor layer 107.

In an example embodiment, the element isolation layer 125 may be formed by an oxidation process or a process of depositing an insulating material. The element isolation layer 125 may be formed to fill the first tunnel portion LT1. In an example embodiment, a portion of each of the semiconductor layer 107 and the intermediate semiconductor layer 120 disposed upwardly and downwardly of the first tunnel portion LT1 may be oxidized to reduce a thickness thereof, and the intermediate semiconductor layer 120 may be completely oxidized.

The second spacer layer 130 may be formed by forming a second layer 134 on the first layer 132. In an example embodiment, the second layer 134 may be formed by a process of forming the element isolation layer 125 described above. Alternately, the second layer 134 may be formed by a separate deposition process. The first layer 132 may remain on the vertical region VR and may be used as a mask layer 132M. In an example embodiment, the second layer 134 may also be formed on the mask layer 132M, and the second layer 134 on the mask layer 132M may be removed by a planarization process or may remain on the first layer 132. An upper region of the substrate insulating layer 191 may be removed such that the substrate insulating layer 191 may have an upper surface having a height (e.g., distance from an upper surface of the substrate 101 in the Z direction) that is similar to or lower than a height of an upper surface of an active region 105.

Referring to the example embodiments of FIGS. 15A to 15D, a second sacrificial layer GS2 may be formed and a recess region RC may be formed by removing a portion of the semiconductor structure.

Figure 15A:
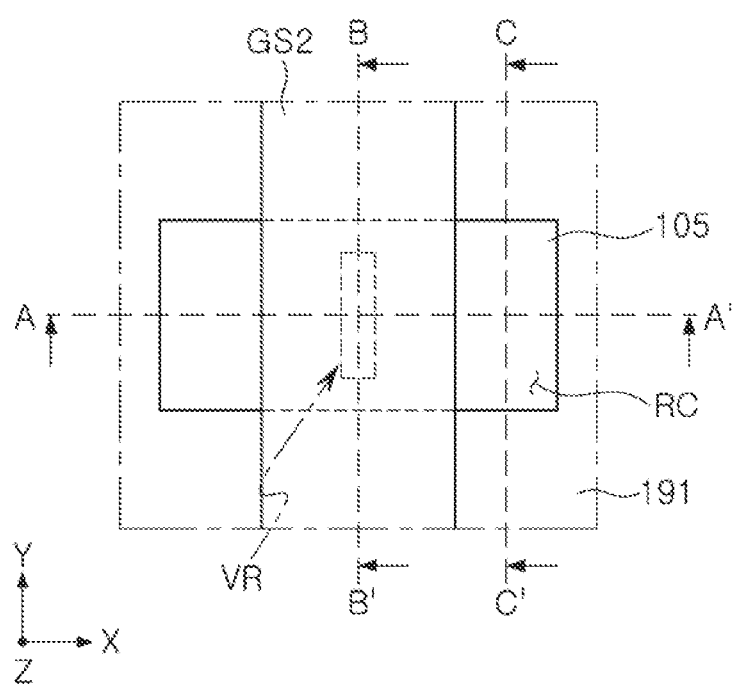
Figure 15B:
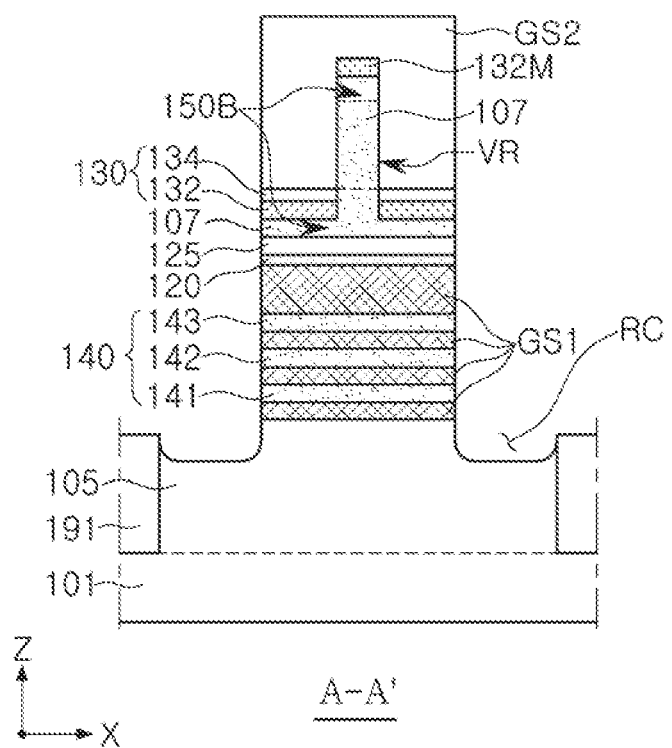
Figure 15C:
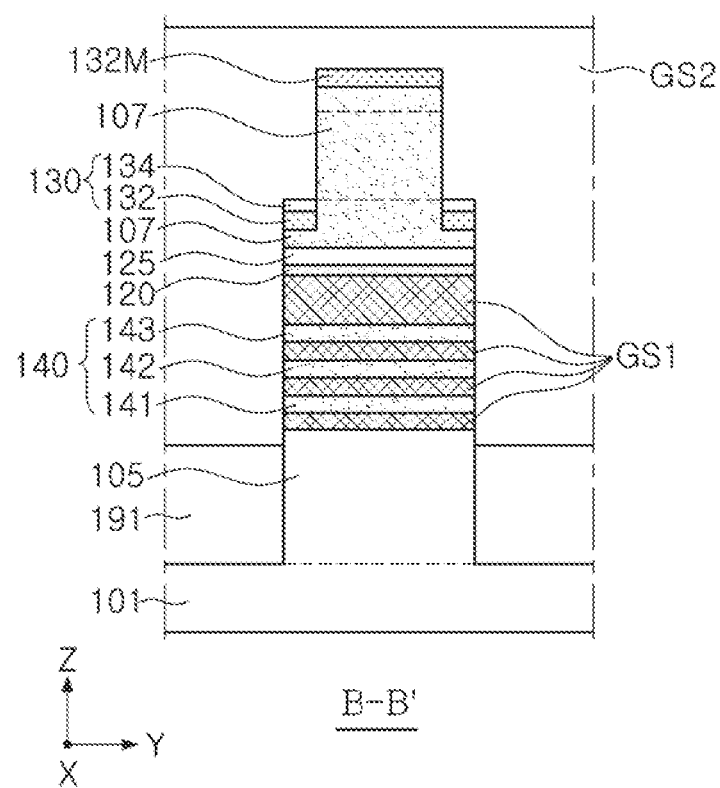
Figure 15D:
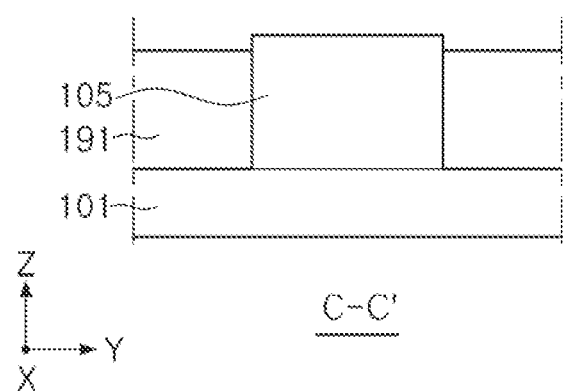

The second sacrificial layer GS2 may function as a mask layer, and as illustrated in the example embodiment of FIG. 15A, the second sacrificial layer GS2 may be patterned to be formed in a position corresponding to the first gate structure 160A illustrated in the example embodiments of FIGS. 1 to 2B in a plan view. By removing a portion of each of the semiconductor structure and the active region 105 using the second sacrificial layer GS2 as a mask, the recess region RC may be formed. In an example embodiment, a depth of the recess region RC may be varied within a range in which lateral surfaces of first channel layer 141 in a lowermost portion may be exposed. By the above-described process, a length of the channel structure 140 in the X direction may be defined, and a length of a channel of a first transistor formed in a lower portion may be determined.

Referring to the example embodiments of FIGS. 16A to 16D, first spacer layers 110 may be formed by partially removing the exposed first sacrificial layers GS1 from lateral surfaces thereof, and first source/drain regions 150A may be formed.

The first sacrificial layers GS1 may be selectively etched with respect to the channel structure 140, the intermediate semiconductor layer 120, and the semiconductor layer 107 by a wet etching process, and may be removed by a certain depth from a lateral surface taken in the X direction. The first sacrificial layers GS1 may have lateral surfaces that are inwardly concave by the lateral surface etching process as described above. However, a shape of the lateral surface of the first sacrificial layers GS1 is not limited to the example embodiments shown in FIG. 2A and. In an example embodiment, the first spacer layers 110 may be formed by filling a region from which the first sacrificial layers GS1 are removed with an insulating material and removing the deposited insulating material on an external side of the channel structure 140.

The first source/drain regions 150A may be formed by performing a selective epitaxial growth process in which the active region 105 and the channel structure 140 are used as seeds. The first source/drain regions 150A may be connected with the first to third channel layers 141, 142, and 143 of the channel structure 140 through lateral surfaces, and may be in contact with the first spacer layers 110 among the first to third channel layers 141, 142, and 143.

Figure 16A:
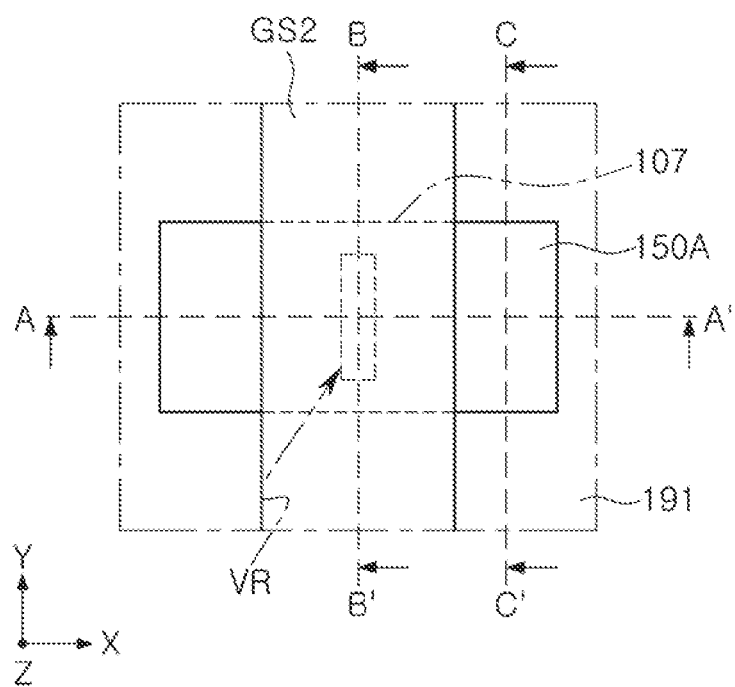
Figure 16B:
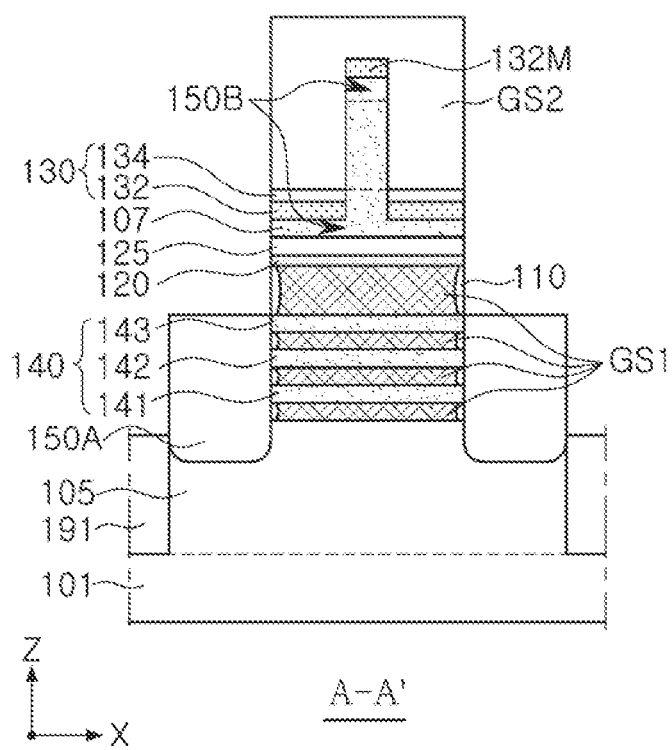
Figure 16C:
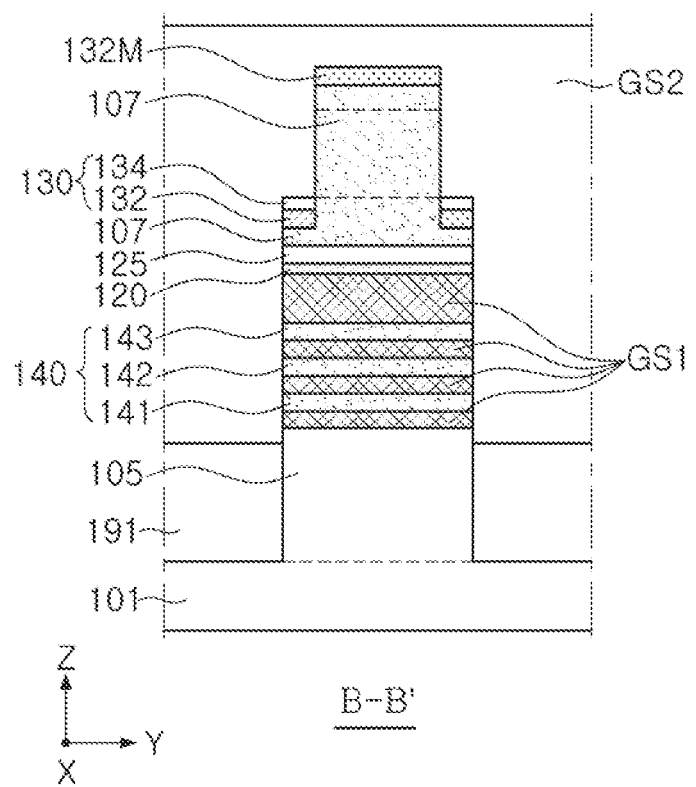
Figure 16D:
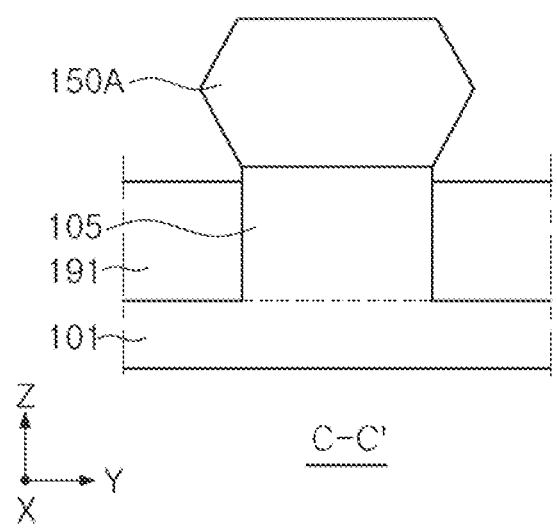
Figure 17A:
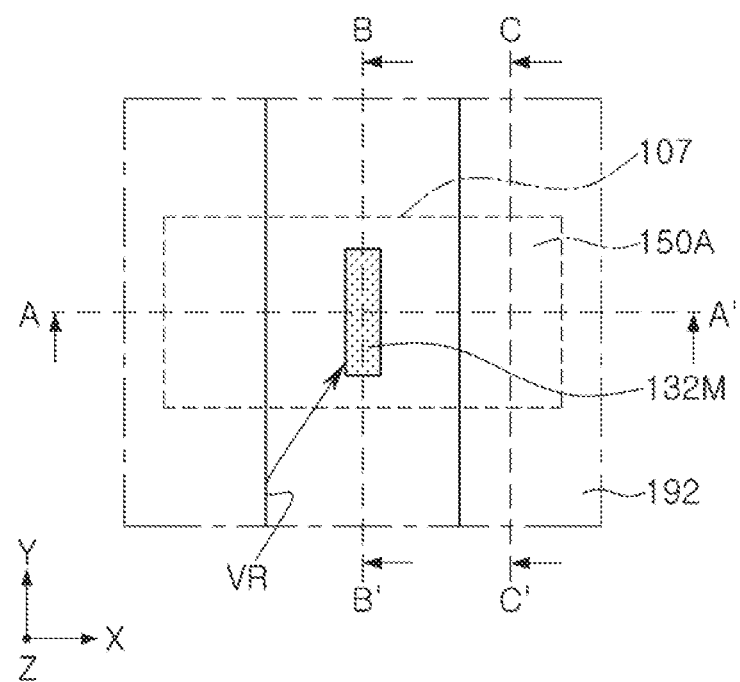
Figure 17B:
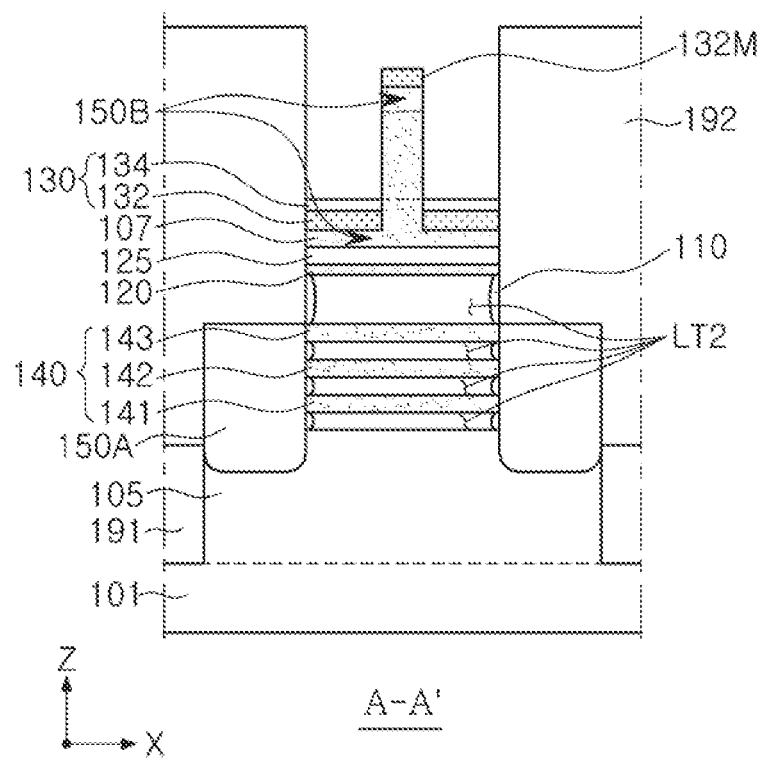
Figure 17C:
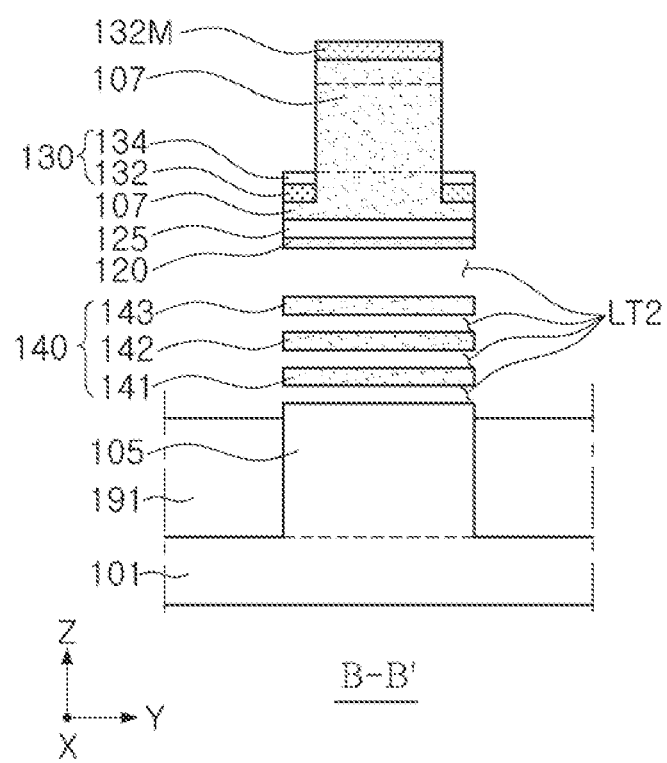
Figure 17D:
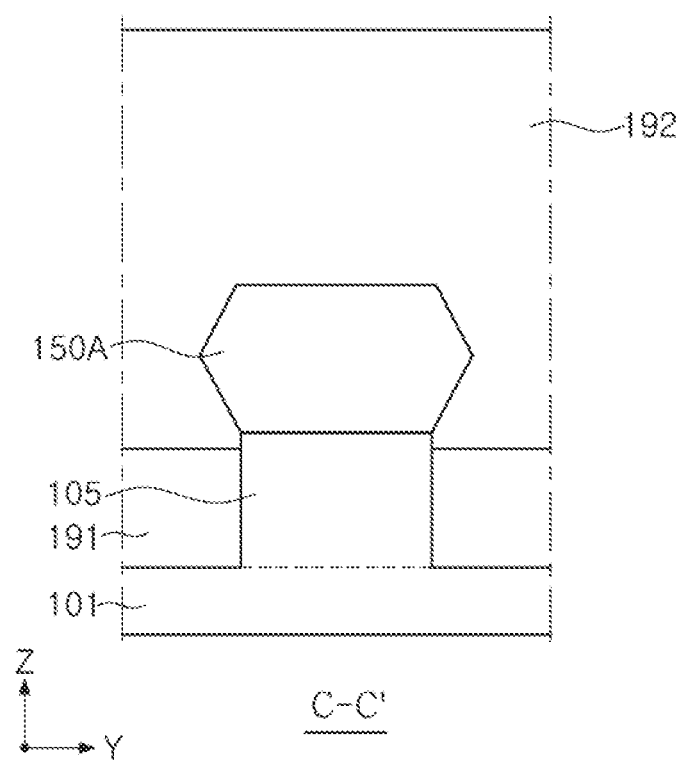
Figure 18A:
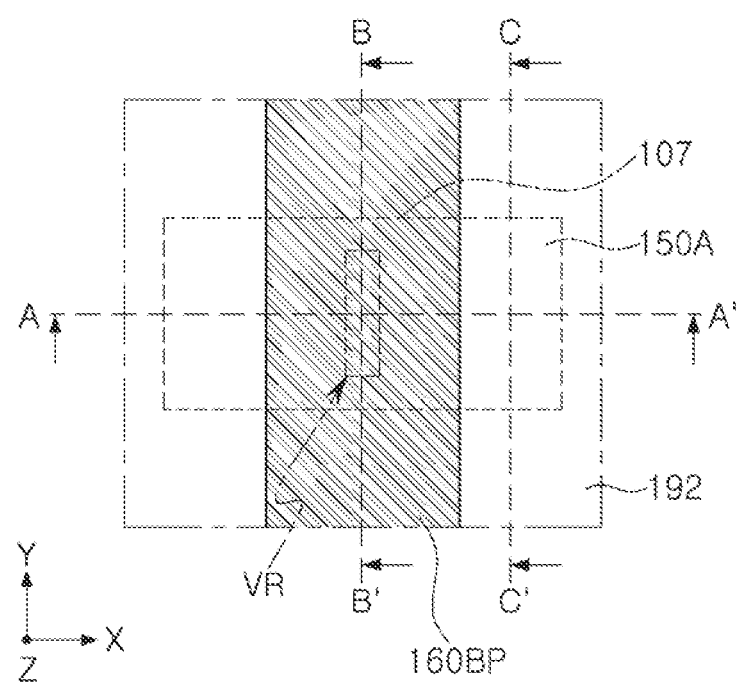
Figure 18B:
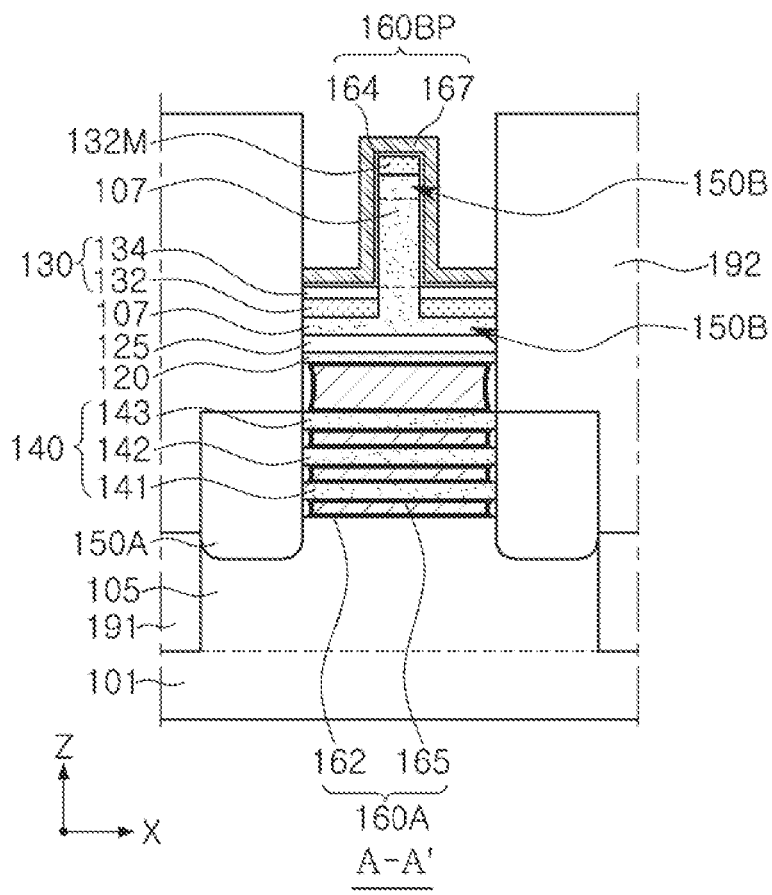
Figure 18C:
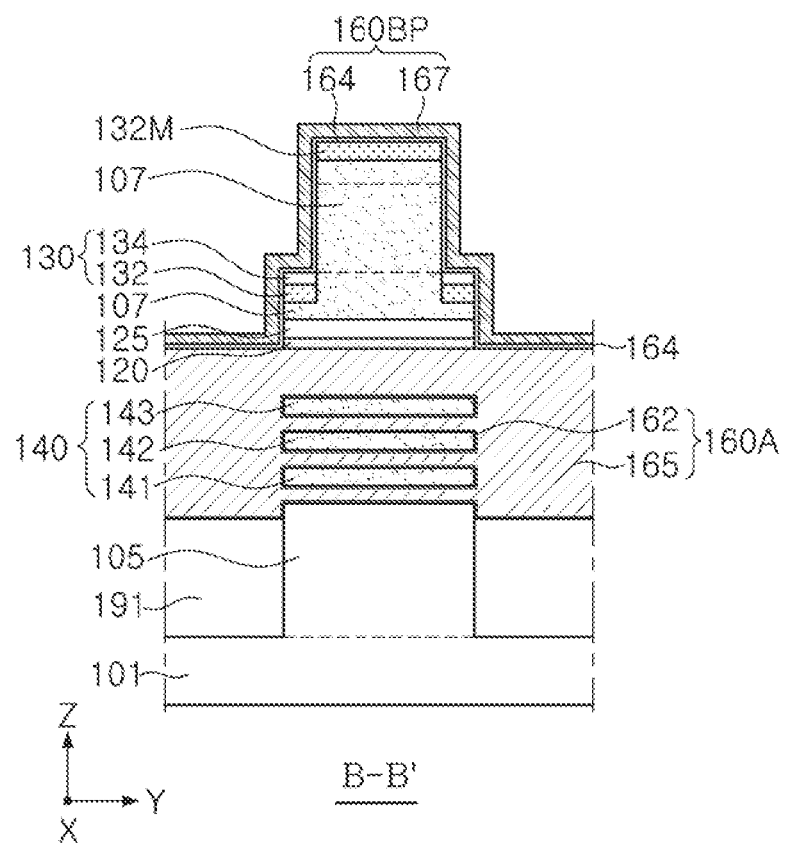
Figure 18D:
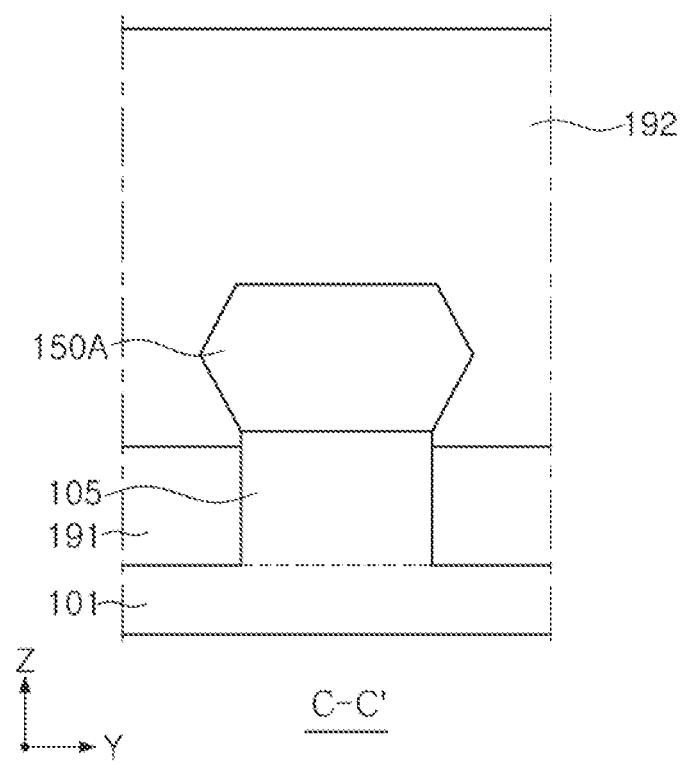
Figure 19A:
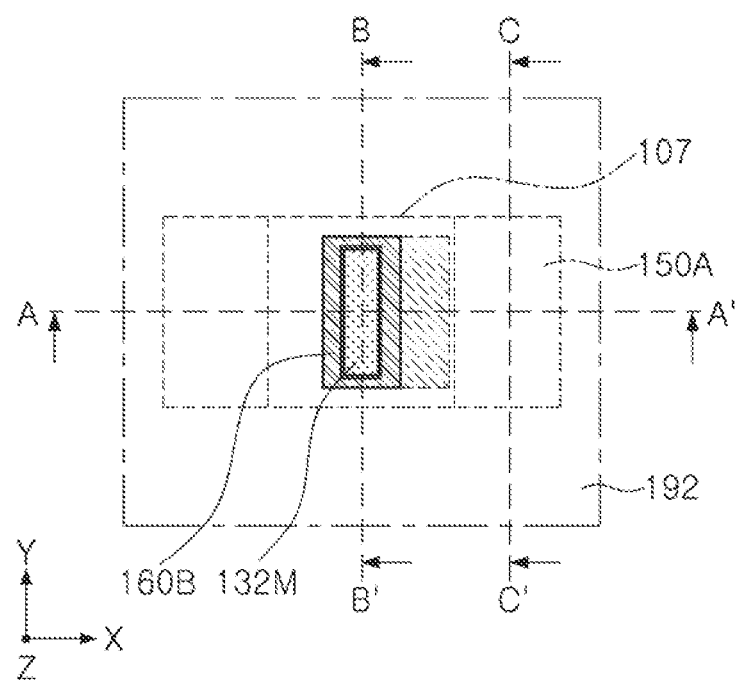
Figure 19B:
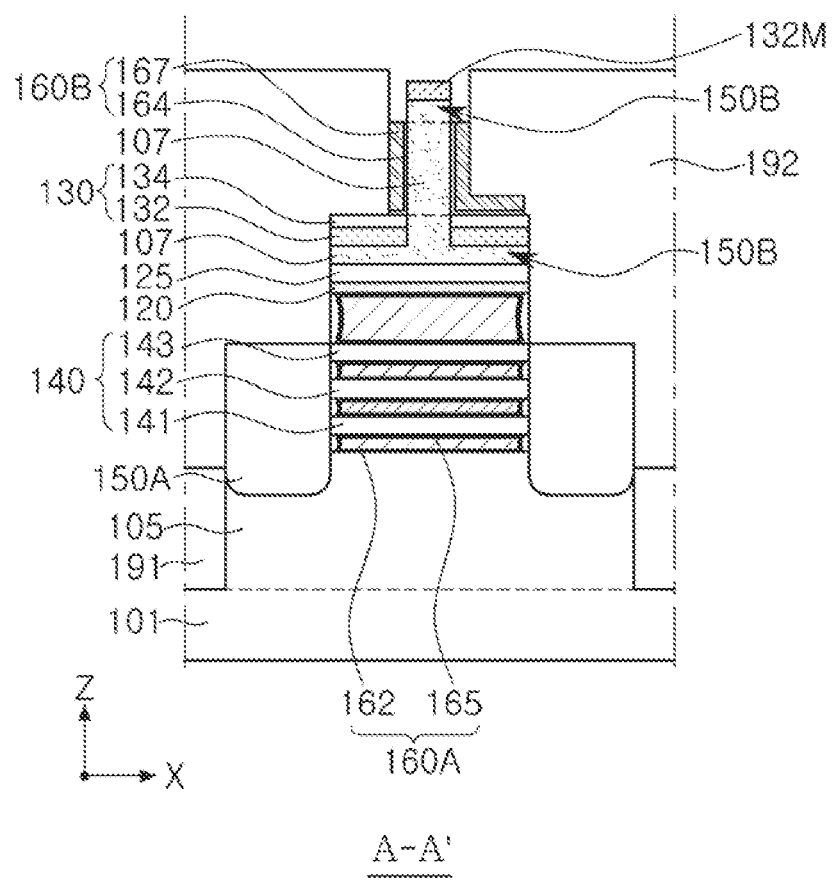
Figure 19C:
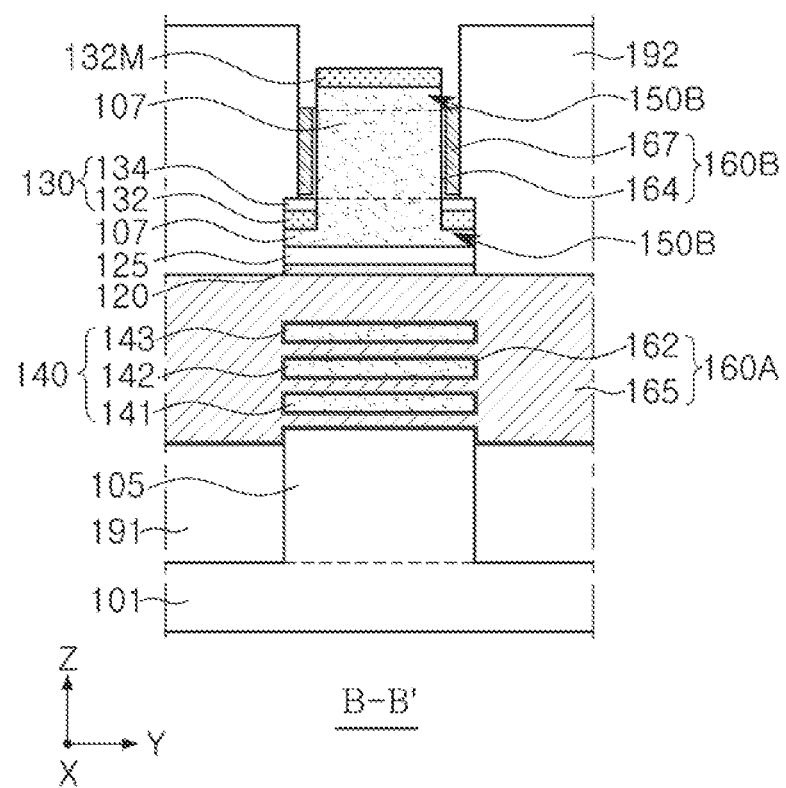
Figure 19D:
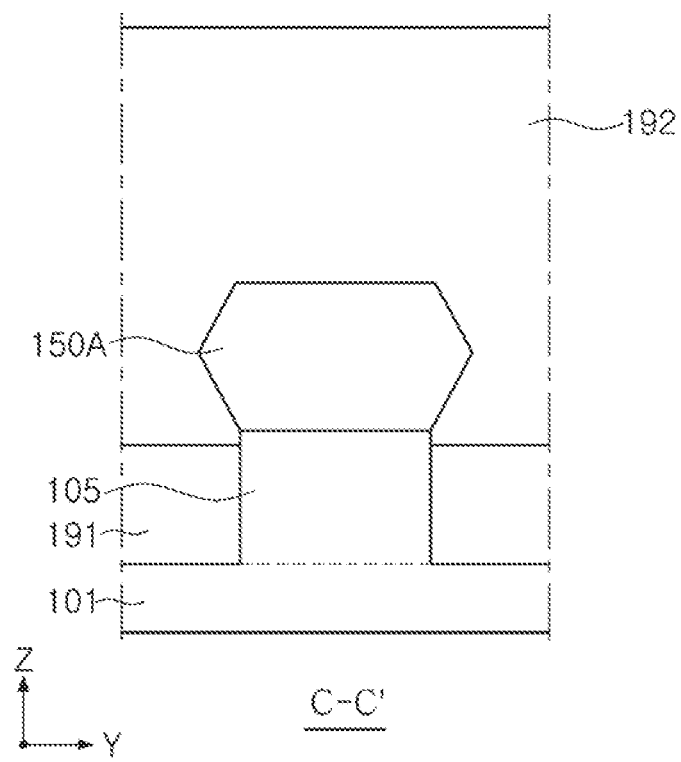
Figure 20A:
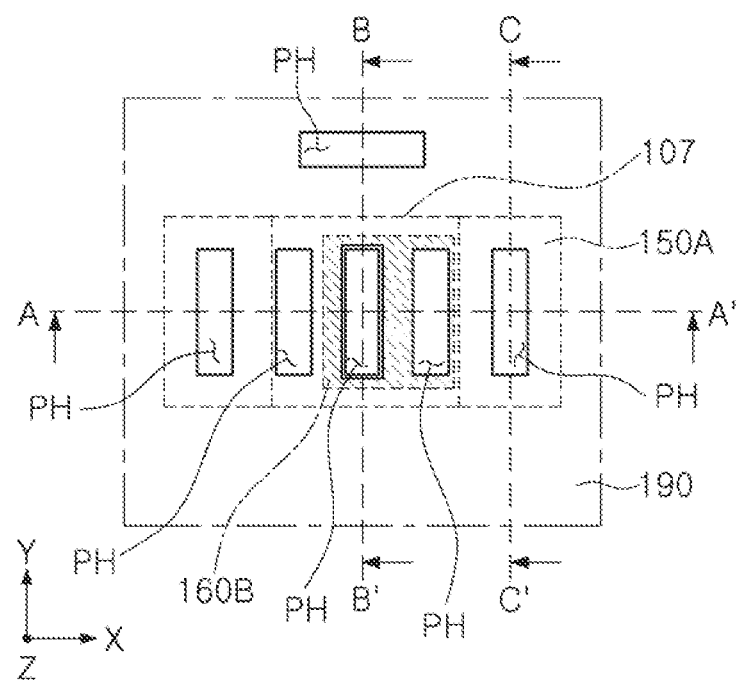
Figure 20B:
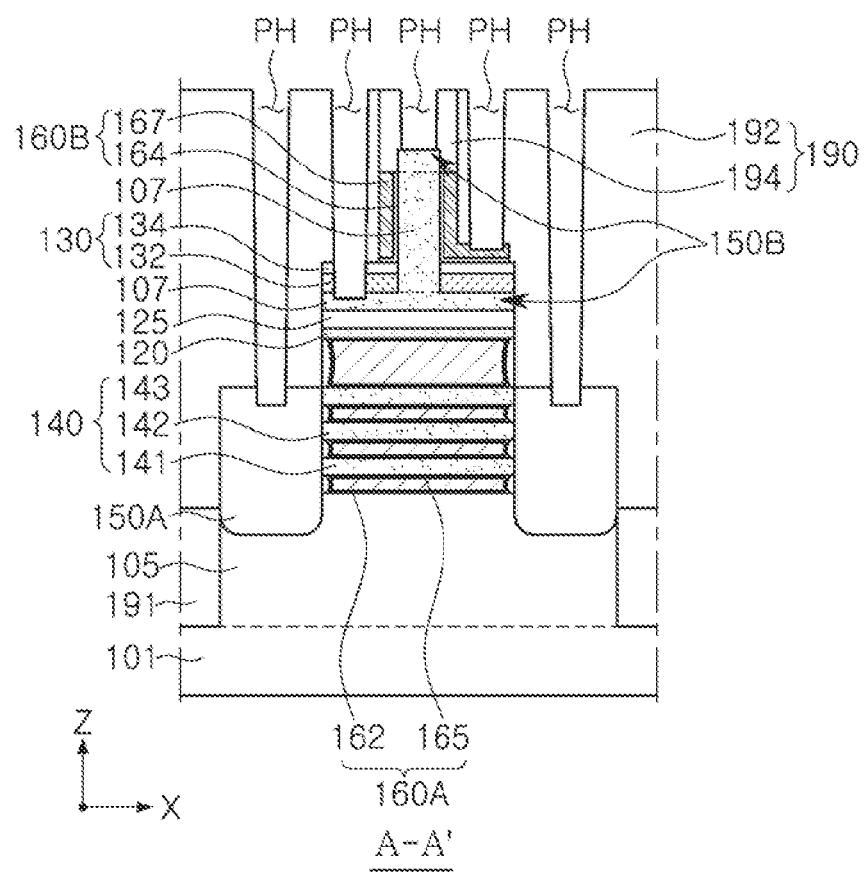
Figure 20C:
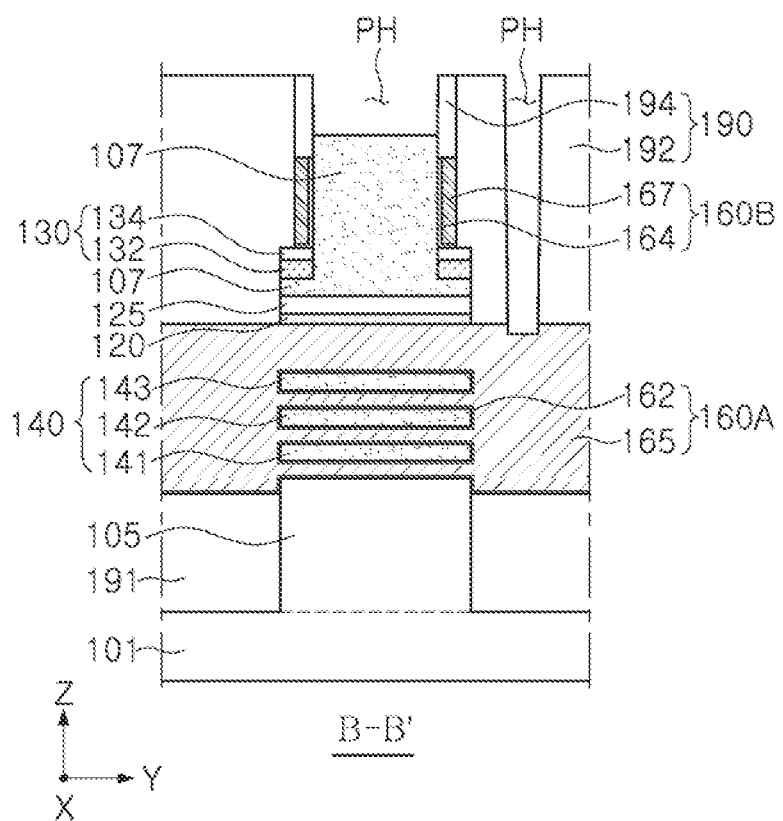
Figure 20D:
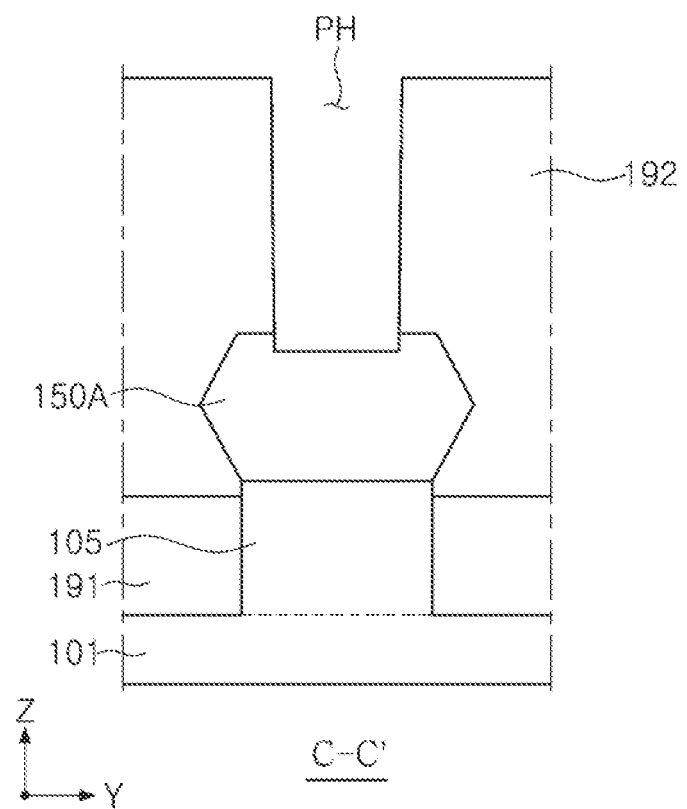

As shown in the example embodiment of FIG. 16D, the first source/drain regions 150A may grow with a facet according to a crystalline plane in the epitaxial growth process on a cross-sectional surface taken in the Y direction. Accordingly, each of the first source/drain regions 150A may have a pentagonal shape or a hexagonal shape. However, example embodiments of the present inventive concepts are not limited thereto and the shape of each of the first source/drain regions 150A may vary.

Referring to the example embodiments of FIGS. 17A to 17D, a first interlayer insulating layer 192 may be formed, and the first sacrificial layers GS1 and the second sacrificial layer GS2 may be removed.

In an example embodiment, the first interlayer insulating layer 192 may be formed by forming an insulating film covering the second sacrificial layer GS2 and the first source/drain regions 150A and performing a planarization process.

The first sacrificial layers GS1 and the second sacrificial layer GS2 may be selectively removed with respect to the channel structure 140, the first spacer layers 110, the intermediate semiconductor layer 120, the semiconductor layer 107, and the first interlayer insulating layer 192. Accordingly, second tunnel portions LT2 may be formed in a region from which the first sacrificial layers GS1 are removed.

Referring to the example embodiments of FIGS. 18A to 18D, the first gate structure 160A may be formed in the second tunnel portions LT2, and a preliminary second gate structure 160BP may be formed on the semiconductor layer 107.

In the first gate structure 160A, gate dielectric layers 162 may be formed to cover internal surfaces of the second tunnel portions LT2 in a conformal manner. Gate electrodes 165 may be formed inside the gate dielectric layers 162 to completely bury the second tunnel portions LT2.

In the preliminary second gate structure 160BP, gate dielectric layers 164 and a gate electrode 167 may be sequentially formed on upper portions of the first gate structure 160A, the second spacer layer 130, and the mask layer 132M. In an exemplary embodiment, at least a portion of processes of forming the first gate structure 160A and the preliminary second gate structure 160BP may be performed simultaneously.

Referring to the example embodiments of FIGS. 19A to 19D, a second gate structure 160B may be formed by patterning the preliminary second gate structure 160BP and partially removing the preliminary second gate structure 160BP from an upper portion.

The preliminary second gate structure 160BP may be patterned such that the preliminary second gate structure 160BP may be only disposed on an upper portion of the semiconductor layer 107. Thereafter, the first interlayer insulating layer 192 may be formed to expose an upper end of the preliminary second gate structure 160BP. The first interlayer insulating layer 192 may be formed to expose only the upper end of the preliminary second gate structure 160BP and a mask layer 132M by additionally depositing and planarizing an insulating material.

Thereafter, by removing the preliminary second gate structure 160BP from an upper end by a certain depth to expose the second source/drain region 150B in the upper portion of the semiconductor layer 107, the second gate structure 160B may be formed.

Referring to the example embodiments of FIGS. 20A to 20D, by forming a second interlayer insulating layer 194 and partially removing an interlayer insulating layer 190, contact holes PH may be formed.

The second interlayer insulating layer 194 may be formed to cover an upper end of the second source/drain regions 150B. For example, as shown in the example embodiment of FIG. the second interlayer insulating layer 194 may be disposed directly on a top surface of the upper portion of the second source/drain regions 150B. Accordingly, the interlayer insulating layer 190 may be formed.

The contact holes PH may be formed by partially removing the interlayer insulating layer 190 from an upper surface to form the first contact plugs 170A and 170B, the second contact plug 175, the third contact plugs 180A and 180B, and the fourth contact plug 185 illustrated in the example embodiments of FIGS. 1 to 2B.

Thereafter, referring to the example embodiments of FIGS. 1 to 2B, by filling the contact holes PH with a conductive material, the first contact plugs 170A and 170B, the second contact plug 175, the third contact plugs 180A and 180B, and the fourth contact plug 185 may be formed.

According to the aforementioned example embodiments, by stacking the semiconductor element including the plurality of channel layers and the semiconductor element including the vertical region, the semiconductor device having a high integration density may be formed.

While the example embodiments have been shown and described above, it will be apparent to those skilled in the art that modifications and variations could be made without departing from the scope of the present inventive concepts as defined by the appended claims.

What is claimed is:

1. A semiconductor device, comprising:
a plurality of channel layers disposed on an active region of a substrate and spaced apart from each other in a first direction that is perpendicular to an upper surface of the substrate;
a first gate structure surrounding the plurality of channel layers;
first source/drain regions disposed on the active region on both lateral sides of the first gate structure and contacting the plurality of channel layers, the first source/drain regions being spaced apart from each other in a second direction that is parallel to the upper surface of the substrate;
an element isolation layer disposed on an upper portion of the first gate structure;
a semiconductor layer disposed on the element isolation layer, the semiconductor layer having a lower region having a planar upper surface and a vertical region protruding from the lower region in the first direction, and the semiconductor layer including second source/drain regions spaced apart from each other in the first direction;

a second gate structure disposed to surround a portion of the vertical region;

a first contact plug connected to one of the second source/drain regions by contacting the lower region; and a second contact plug connected to other of the second source/drain regions by contacting the vertical region.

2. The semiconductor device of claim 1, wherein the vertical region is surrounded by the lower region in a plan view defined in the second direction and a third direction that is parallel to the upper surface of the substrate.

3. The semiconductor device of claim 1, wherein an area of the vertical region is smaller than an area of the lower region in a plan view defined in the second direction and a third direction that is parallel to the upper surface of the substrate.

4. The semiconductor device of claim 1, comprising:
a spacer layer disposed between the lower region and the second gate structure in the first direction.

5. The semiconductor device of claim 4, wherein the second gate structure is disposed on a portion of the spacer layer to expose a portion of the spacer layer.

6. The semiconductor device of claim 5, wherein the first contact plug penetrates the spacer layer exposed by the second gate structure and is connected to the lower region.

7. The semiconductor device of claim 1, wherein:
the second gate structure has a horizontal extension portion extending in the second direction on the lower region and on one lateral side of the vertical region, and
the semiconductor device comprises a third contact plug connected to the horizontal extension portion.

8. The semiconductor device of claim 1, wherein the vertical region includes a plurality of vertical regions spaced apart from each other in the second direction.

9. The semiconductor device of claim 1, wherein an entirety of the second gate structure overlaps the semiconductor layer in the first direction.

10. The semiconductor device of claim 9, wherein the second gate structure has an area smaller than an area of the semiconductor layer in a plan view defined in the second direction and a third direction that is parallel to the upper surface of the substrate.

11. A semiconductor device, comprising:
a plurality of channel layers disposed on an active region of a substrate and spaced apart from each other in a first direction that is perpendicular to an upper surface of the substrate;
a first gate structure surrounding the plurality of channel layers;
first source/drain regions disposed on the active region on both lateral sides of the first gate structure and contacting the plurality of channel layers, the first source/drain regions being spaced apart from each other in a second direction that is parallel to the upper surface of the substrate;
a semiconductor layer disposed on an upper portion of the first gate structure, the semiconductor layer having a lower region having a planar upper surface and a vertical region protruding from the lower region in the first direction, and including second source/drain regions spaced apart from each other in the first direction; and
a second gate structure disposed to surround a portion of a lateral surface of the semiconductor layer;
wherein an area of the vertical region is smaller than an area of the lower region in a plan view defined in the second direction and a third direction that is parallel to the upper surface of the substrate.

12. The semiconductor device of claim 11, comprising:
a first contact plug directly connected to the lower region; and
a second contact plug directly connected to the vertical region.

13. The semiconductor device of claim 12, comprising:
third contact plugs connected to the first source/drain regions, respectively;
a fourth contact plug connected to the first gate structure; and
a fifth contact plug connected to the second gate structure.

14. The semiconductor device of claim 13, wherein the first to fifth contact plugs have different heights.

15. The semiconductor device of claim 11, comprising:
a first spacer layer disposed on both lateral sides of the first gate structure and on an upper surface and a lower surface of the plurality of channel layers.

16. The semiconductor device of claim 11, comprising:
a second spacer layer disposed between the semiconductor layer and the second gate structure in the first direction.

17. The semiconductor device of claim 11, wherein:
an entirety of the second gate structure overlaps the semiconductor layer in the first direction, and
the second gate structure has an area smaller than an area of the semiconductor layer in the plan view.

18. The semiconductor device of claim 11, wherein the second gate structure is disposed to overlap the first gate structure in the plan view.

19. The semiconductor device of claim 11, comprising:
an element isolation layer comprising an insulating material is disposed between the first gate structure and the semiconductor layer.

20. The semiconductor device of claim 19, wherein the plurality of channel layers, the element isolation layer, and the semiconductor layer have lateral edges that are substantially coplanar with one another.

* * * * *